United States Patent
Tsai et al.

(10) Patent No.: US 12,532,731 B2
(45) Date of Patent: Jan. 20, 2026

(54) INTERCONNECT STRUCTURE

(71) Applicant: TAIWAN SEMICONDUCTOR MANUFACTURING COMPANY LTD., Hsinchu (TW)

(72) Inventors: Jung-Chou Tsai, Hsinchu (TW); Fong-Yuan Chang, Hsinchu County (TW); Po-Hsiang Huang, Tainan (TW); Chin-Chou Liu, Hsinchu County (TW); Yi-Kan Cheng, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/648,515

(22) Filed: Apr. 29, 2024

(65) Prior Publication Data
US 2024/0274561 A1    Aug. 15, 2024

Related U.S. Application Data

(60) Continuation of application No. 17/811,896, filed on Jul. 12, 2022, now Pat. No. 12,002,776, which is a
(Continued)

(51) Int. Cl.
*H01L 23/528* (2006.01)
*H01L 23/00* (2006.01)
(Continued)

(52) U.S. Cl.
CPC .......... *H01L 24/06* (2013.01); *H01L 23/5226* (2013.01); *H01L 23/528* (2013.01);
(Continued)

(58) Field of Classification Search
None
See application file for complete search history.

(56) References Cited

U.S. PATENT DOCUMENTS 8,541,831 B2 *  9/2013  Chae ............... H01L 23/535
                                                      257/329
9,642,259 B2 *  5/2017  Kim ................. H05K 1/11
(Continued)

FOREIGN PATENT DOCUMENTS

EP      1391927 A2 *  2/2004  ........... H01L 23/50
JP   2017112378 A  *  6/2017  ....... H01L 21/76816
(Continued)

*Primary Examiner* — Telly D Green
(74) *Attorney, Agent, or Firm* — WPAT LAW; Anthony King

(57) ABSTRACT

An interconnect structure includes a plurality of first pads, a plurality of second pads, and a plurality of conductive lines. The first pads are arranged to form a first column-and-row array, and the second pads are arranged to form a second column-and-row array. The first column-and-row array, the second column-and-row array and the conductive lines are disposed in a same layer. The first pads in adjacent rows in the first column-and-row array are separated from each other by a first vertical distance from a plan view, the second pads in adjacent rows in the second column-and-row array are separated from each other by a second vertical distance from the plan view. A sum of widths of the conductive lines electrically connecting the first pads and the second pads in the same row is less than the first vertical distance and the second vertical distance from the plan view.

20 Claims, 16 Drawing Sheets

Related U.S. Application Data division of application No. 16/883,929, filed on May 26, 2020, now Pat. No. 11,532,580.

(60) Provisional application No. 62/893,716, filed on Aug. 29, 2019.

(51) Int. Cl.
  *H01L 23/522* (2006.01)
  *H01L 25/065* (2023.01)

(52) U.S. Cl.
  CPC .............. *H01L 24/03* (2013.01); *H01L 24/05* (2013.01); *H01L 24/08* (2013.01); *H01L 24/50* (2013.01); *H01L 24/89* (2013.01); *H01L 25/0655* (2013.01); *H01L 2224/0557* (2013.01); *H01L 2224/06131* (2013.01); *H01L 2224/08225* (2013.01); *H01L 2224/80895* (2013.01); *H01L 2224/80896* (2013.01)

(56) References Cited

U.S. PATENT DOCUMENTS

| | | | | |
|---|---|---|---|---|
| 9,831,169 | B2* | 11/2017 | Zhang | H01L 21/4853 |
| 9,935,081 | B2* | 4/2018 | Pan | H01L 25/50 |
| 10,115,706 | B2* | 10/2018 | Chae | H01L 24/02 |
| 10,559,533 | B2* | 2/2020 | Sasaki | H10B 43/50 |
| 10,658,279 | B2* | 5/2020 | Ganesan | H01L 24/17 |
| 10,985,112 | B2* | 4/2021 | Eom | H10B 43/35 |
| 11,177,322 | B2* | 11/2021 | Lee | H10F 39/807 |
| 11,532,580 | B2* | 12/2022 | Tsai | H01L 23/5386 |
| 12,002,776 | B2* | 6/2024 | Tsai | H01L 23/528 |
| 2008/0173932 | A1* | 7/2008 | Kidoh | H10D 30/69 257/E21.679 |
| 2009/0244874 | A1* | 10/2009 | Mahajan | H01L 24/16 257/E21.499 |
| 2010/0133598 | A1* | 6/2010 | Chae | H10B 41/27 257/314 |
| 2011/0233543 | A1* | 9/2011 | Matusiewicz | G03F 1/62 257/E21.59 |
| 2013/0168854 | A1* | 7/2013 | Karikalan | H01L 24/73 257/784 |
| 2014/0048928 | A1* | 2/2014 | Li | H01L 23/49811 257/737 |
| 2015/0228584 | A1* | 8/2015 | Huang | H01L 25/50 438/618 |
| 2015/0228602 | A1* | 8/2015 | Sato | H01L 24/06 257/773 |
| 2016/0163628 | A1* | 6/2016 | We | H01L 23/49811 257/664 |
| 2017/0092617 | A1* | 3/2017 | Wu | H01L 21/565 |
| 2017/0098624 | A1* | 4/2017 | Chae | H01L 25/0657 |
| 2017/0179028 | A1* | 6/2017 | Lee | H10B 41/20 |
| 2019/0123006 | A1* | 4/2019 | Chen | H01L 24/08 |
| 2019/0172778 | A1* | 6/2019 | Ganesan | H01L 23/50 |
| 2020/0075548 | A1* | 3/2020 | Kim | H01L 24/16 |
| 2020/0194448 | A1* | 6/2020 | Kim | H01L 23/5226 |
| 2021/0343650 | A1* | 11/2021 | Peng | H01L 25/0652 |

FOREIGN PATENT DOCUMENTS

| | | | | |
|---|---|---|---|---|
| JP | 6184477 B2 * | 8/2017 | ............. | B21F 9/005 |
| KR | 20200010954 A * | 1/2020 | ....... | H01L 21/76816 |

* cited by examiner

INTERCONNECT STRUCTURE

PRIORITY DATA

This patent is a continuation application of U.S. patent application Ser. No. 17/811,896, filed on Jul. 12, 2022, entitled of "INTERCONNECT STRUCTURE AND METHOD FOR FORMING THE SAME," which is a divisional application of U.S. patent application Ser. No. 16/883,929, filed on May 26, 2020, entitled of "INTERCONNECT STRUCTURE, SEMICONDUCTOR STRUCTURE INCLUDING INTERCONNECT STRUCTURE AND METHOD FOR FORMING THE SAME", which claims the benefit of U.S. Provisional Patent Application Ser. No. 62/893,716 filed Aug. 29, 2019, the entire disclosure of which is hereby incorporated by reference.

BACKGROUND

The semiconductor industry has experienced rapid growth due to continuous improvements in the integration density of a variety of electronic components (e.g., transistors, diodes, resistors, capacitors, etc.). Such improvement in integration density allows more components to be integrated into a given area. As the demands for miniaturization, higher speed and greater bandwidth, as well as lower power consumption and latency, have grown recently, there are increasing needs for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers or dies may be installed on top of one another to further reduce the form factor of the semiconductor device. Interconnect structures are therefore needed to provide electrical connections between the semiconductor wafers or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
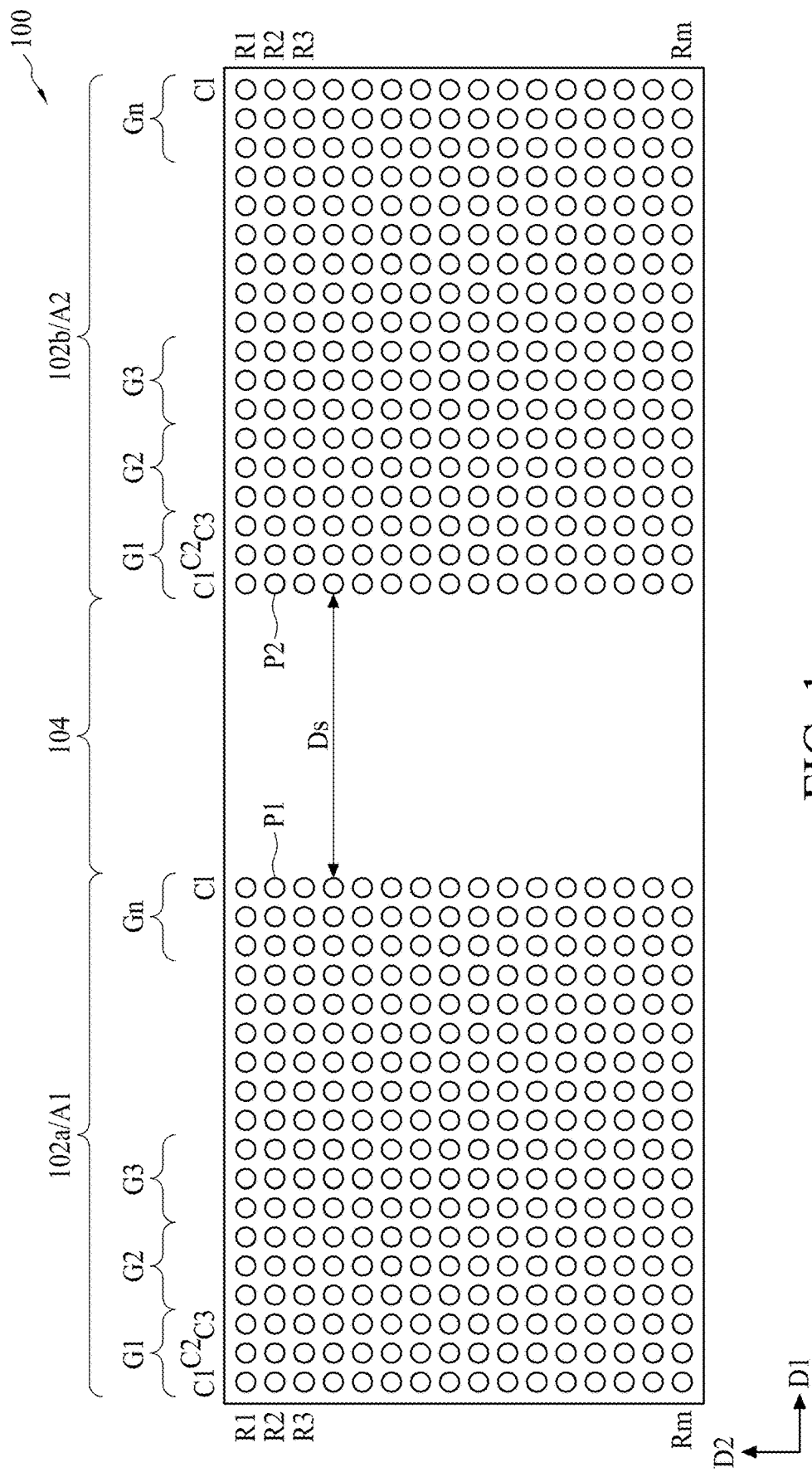
FIG. 1 is a schematic view illustrating a portion of an interconnect structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The term "interconnect structure" refers to a structure providing electrical connection between two workpieces such as two dies, two semiconductor packages, or two sets of terminals over one die/semiconductor package. In some embodiments, the interconnect structure includes a plurality of conductive lines (also referred to as routing resources) and a plurality of vias disposed in a plurality of dielectric layers. In some embodiments, the interconnect structure can be a part of a die, a part of a semiconductor package, a part of a printed circuit board (PCB), a part of an interposer, or the like.

The routing resources of the interconnect structure are horizontal conductive lines serving as main tracks providing the electrical connections. In some embodiments, the routing resources occupy a majority of area in every layer of the interconnect structure, while the vias are used to electrically connect the routing resources in different layers. To electrically connect two dies (two packages or two sets of bonds over one die), the routing sources in different layers may connect one pad disposed over one of the two dies to another pad disposed over the other die through the vias. It is found that such routing design is complicated and utilization of the routing resources is not efficient.

The present disclosure therefore provides an interconnect structure having a simple and more efficient routing design.

In some embodiments, the interconnect structure may include two sets of pads: a plurality of first pads and a plurality of second pads, wherein the two sets of pads may be bonded to pads over two dies (also referred to as chips) or two packages. In some embodiments, the two sets of pads may be bonded to pads disposed over a same wafer, a same die or a same package, but separated from each other. In some embodiments, the first pads and the second pads are arranged to form arrays having columns and rows. In some embodiments, the rows formed by the first pads are aligned with the rows formed by the second pads. In some embodiments, the first pads may be grouped into a plurality of groups, such as a first group, a second group and an $n^{th}$ group, arranged in columns. In some embodiments, the second pads may be grouped into a plurality of groups, such as a first group, a second group and an $n^{th}$ group, arranged in columns. In some embodiments, the first pads and the second pads are electrically connected group-by-group. For example, the first pads and the second pads in the same group are electrically connected through conductive lines in a same layer. In some embodiments, the first pads and the second pads in the same group, including those in different rows, are electrically connected through conductive lines in the same layer. In some embodiments, first pads and second pads in separate groups, including those in a same row, are electrically connected through conductive lines in another layer. Accordingly, utilization of the routing resources (the conductive lines) is improved and design for the routing resources is simplified by the provided interconnect structure.

FIG. 1 is a schematic view of a portion of an interconnect structure according to aspects of the present disclosure. In some embodiments, the interconnect structure 100 can include a first region 102a and a second region 102b, wherein the first region 102a and second region 102b are separated from each other by a spacing region 104. In some embodiments, the interconnect structure 100 can include two sets of pads P1 and P2. For example, the interconnect structure 100 can include a plurality of first pads P1 disposed in the first region 102a and a plurality of second pads P2 disposed in the second region 102b. In some embodiments, a quantity of the first pads P1 and a quantity of the second pads P2 are the same, but the disclosure is not limited thereto. As shown in FIG. 1, the first pads P1 are arranged to form a first array A1, and the second pads P2 are arranged to form a second array A2. Each of the first array A1 and the second array A2 has a plurality of rows (i.e., the first row R1, the second row R2, the third row R3 and the $m^{th}$ row Rm) extending along a first direction D1, and a plurality of columns (i.e., the first column C1, the second column C2, the third column C3 and the $l^{th}$ column Cl) extending along a second direction D2. In some embodiments, the first direction D1 and the second direction D2 are perpendicular to each other. In some embodiments, m and l respectively are positive integer equal to or greater than 2. In some embodiments, m is equal to l. In some alternative embodiments, m is different from l. In other words, the first array A1 and the second array A2 respectively have rows (i.e., the first row R1, the second row R2, the third row R3 and the $m^{th}$ row Rm) extending along the first direction D1 and parallel to each other along the second direction D2.

In some embodiments, the first pads P1 in the first array A1 are arranged along the first direction D1 to form the first row R1, the second row R2, the third row R3 and the $m^{th}$ row Rm. The first pads P1 in the first array A1 are arranged along the second direction D2 to form the first column C1, the second column C2, the third column C3 and the $l^{th}$ column C1. Similarly, the second pads P2 in the second array A2 are arranged along the first direction D1 to form the first row R1, the second row R2, the third row R3 and the $m^{th}$ row Rm. The second pads P2 in the second array A2 are arranged along the second direction D2 to form the first column C1, the second column C2, the third column C3 and the $l^{th}$ column Cl. In some embodiments, the first pads P1 in the first row R1 of the first array A1 are aligned with the second pads P2 in the first row R1 of the second array A2, the first pads P1 in the second row R2 of the first array A1 are aligned with the second pads P2 in the second row R2 of the second array A2, and the first pads P1 in the $m^{th}$ row Rm of the first array A1 are aligned with the second pads P2 in the $m^{th}$ row Rm of the second array A2, as shown in FIG. 1.

The first pads P1 are separated from each other. For example, in each of the rows R1, R2 and Rm of the first array A1, the first pads P1 are separated from each other by a first horizontal distance Dh1 (shown in FIG. 5), and in each of the columns C1, C2 and Cl of the first array A1, the first pads P1 are separated from each other by a first vertical distance Dv1 (shown in FIG. 5). In some embodiments, the first horizontal distance Dh1 and the first vertical distance Dv1 are the same, but the disclosure is not limited thereto. Similarly, the second pads P2 are separated from each other. For example, in each of the rows R1, R2 and Rm of the second array A2, the second pads P2 are separated from each other by a second horizontal distance Dh2 (shown in FIG. 5), and in each of the columns C1, C2 and Cl of the second array A2, the second pads P2 are separated from each other by a second vertical distance Dv2 (shown in FIG. 5). In some embodiments, the second horizontal distance Dh2 and the second vertical distance Dv2 are the same, but the disclosure is not limited thereto. In some embodiments, the first horizontal distance Dh1 and the second horizontal distance Dh2 are the same, and the first vertical distance Dv1 and the second vertical distance Dv2 are the same, but the disclosure is not limited thereto. Further, at least one of the first pads P1, such as the first pad P1 in the $l^{th}$ column Cl of the first array A1, is adjacent to one of the second pads P2, such as the second pad P2 in the first column C1 of the second array A2. The at least one of the first pads P1 is separated from the adjacent second pad P2 by a spacing distance Ds, and the spacing distance Ds is greater than the first horizontal distance Dh1 and the second horizontal distance Dh2, as shown in FIG. 1. In some embodiments, the spacing distance Ds is substantially equal to a width of the spacing region 104, but the disclosure is not limited thereto.

In some embodiments, the first pads P1 are grouped into a first group G1, a second group G2, a third group G3 and an $n^{th}$ group Gn. In some embodiments, n is an integer equal to or greater than 2. As shown in FIG. 1, the first pads P1 in each of the first row R1, the second row R2 and the $m^{th}$ row Rm of the first array A1 are respectively grouped into the first group G1, the second group G2 and the $n^{th}$ group Gn. The first group G1, the second group G2 and the $n^{th}$ group Gn extend along the second direction D2 and are parallel to each other along the first direction D1. In other words, each of the first group G1, the second group G2 and the $n^{th}$ group Gn includes some columns of the first array A1. Further, quantities of the first pads P1 in each of the first group G1, the second group G2 and the $n^{th}$ group Gn are the same. Similarly, the second pads P2 are grouped into a first group G1, a second group G2, a third group G3 and an $n^{th}$ group Gn. As shown in FIG. 1, the second pads P2 in each of the first row R1, the second row R2 and the $m^{th}$ row Rm of the second array A2 are grouped into the first group G1, the second group G2 and the $n^{th}$ group Gn. The first group G1, the second group G2 and the $n^{th}$ group Gn extend along the second direction D2 and are parallel to each other along the first direction D1. In other words, each of the first group G1, the second group G2 and the $n^{th}$ group Gn includes some columns of the second array A2. Further, quantities of the second pads P2 in each of the first group G1, the second group G2 and the $n^{th}$ group Gn are the same.

Figure 2:
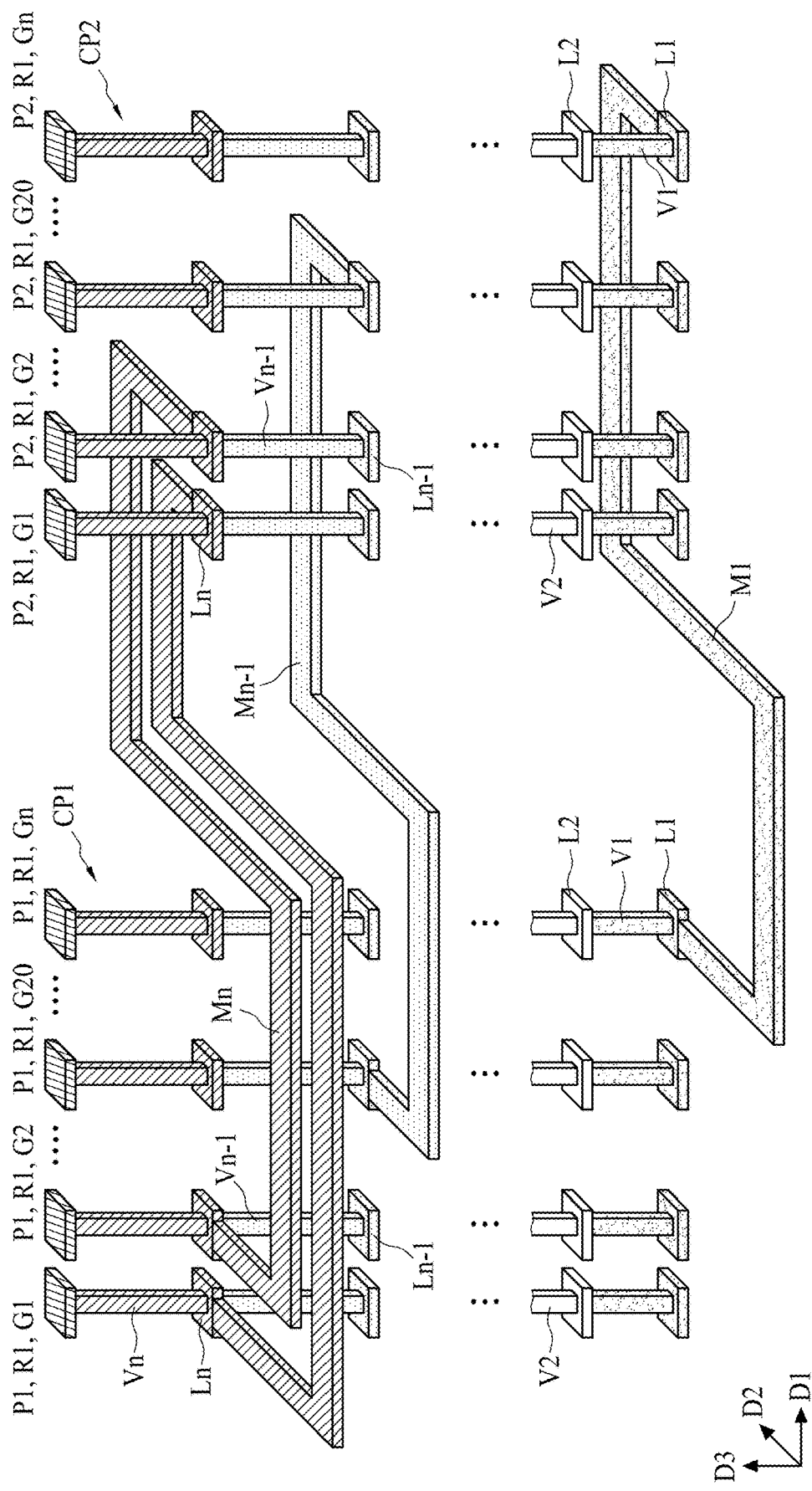
FIG. 2 is a perspective view illustrating a portion of an interconnect structure for a semiconductor structure according to aspects of the present disclosure.
Figure 3:
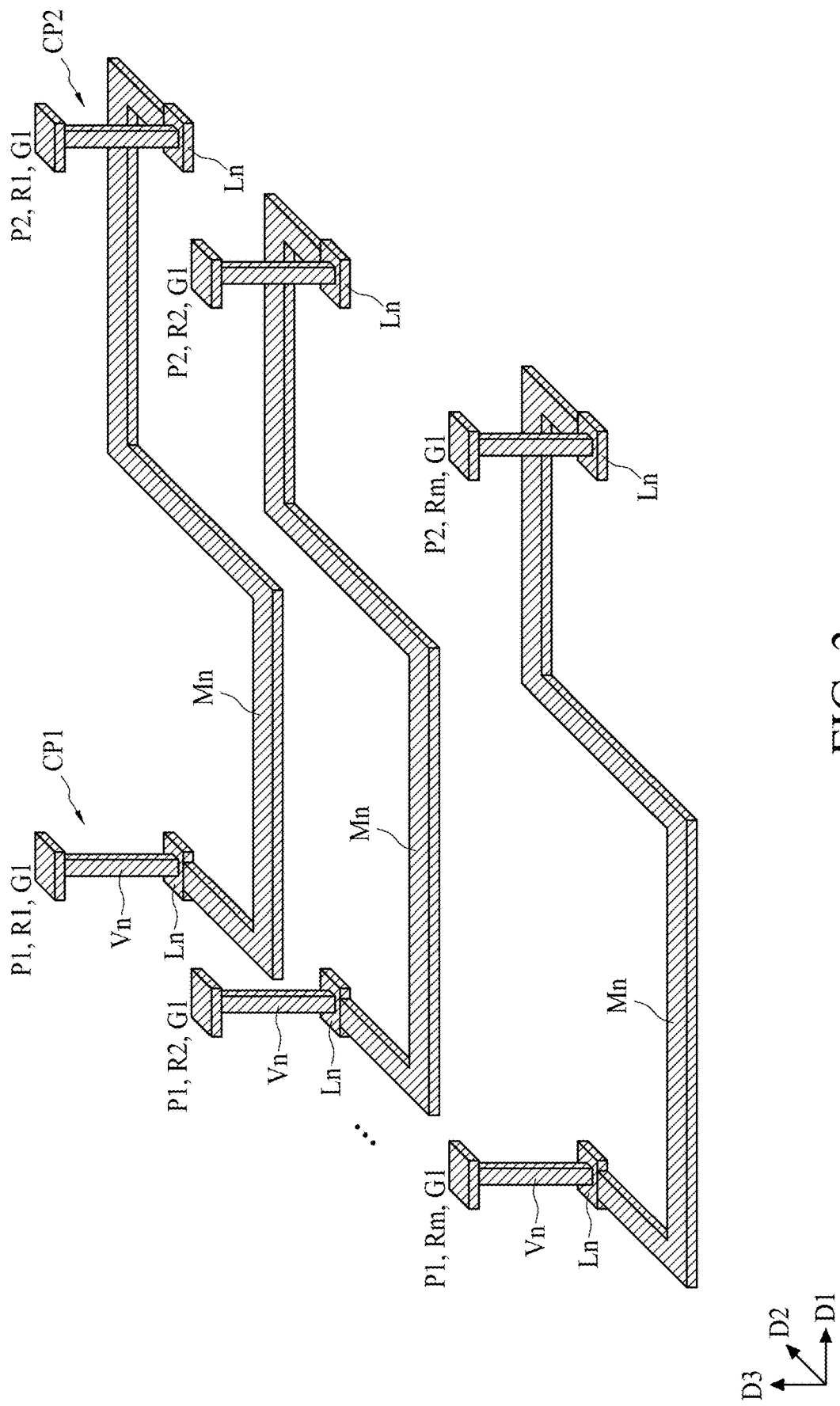
FIG. 3 is a perspective view illustrating a portion of an interconnect structure for a semiconductor structure according to aspects of the present disclosure.

Referring to FIGS. 2 and 3, the interconnect structure 100 further includes a plurality of first conductive lines disposed in a first layer, a plurality of second conductive lines disposed in a second layer and a plurality of $n^{th}$ conductive lines disposed in an $n^{th}$ layer. The first layer, the second layer and the $n^{th}$ layer are stacked to form a multi-layered structure. In some embodiments, the first layer, the second layer and the $n^{th}$ layer can be dielectric layers. In some embodiments, the conductive lines formed in a lowest dielectric layer can be referred to as a first metallization (M1) layer, the conductive lines formed in the dielectric layer over the M1 layer can be referred to as a second metallization (M2) layer, and the embodiments may utilize one or more other metallization layers, such as a third metallization (M3) layer to an upper most metallization (Mn) layer.

Referring to FIG. 2, in some embodiments, the interconnect structure 100 includes a plurality of first conductive pillars CP1 disposed in the first region 102a and a plurality of second conductive pillar CP2 disposed in the second region 102b. Each of the first pads P1 is coupled to one of the first conductive pillars CP1, and each of the second pads P2 is coupled to one of the second conductive pillars CP2. Each of the first conductive pillars CP1 includes a plurality of vias and a plurality of landing ports. As shown in FIG. 2, the vias and the landing ports are alternately disposed. Each of the second conductive pillars CP2 includes a plurality of vias and a plurality of landing ports. As shown in FIG. 2, the vias and the landing ports are alternately disposed. Details about the vias and the landing ports will be discussed in the following description. The first conductive pillars CP1 and the second conductive pillars CP2 are embedded in and penetrates the first layer, the second layer and the $n^{th}$ layer.

Referring to FIG. 2, in some embodiments, each of the first pads P1 in the first row R1 in the first group G1 of the first array A1 is electrically connected to one of the second pads P2 in the first row R1 in the first group G1 of the second array A2 by the first conductive pillar CP1 and one of the first conductive lines in the first layer. In some embodiments, the first conductive lines are the uppermost metallization layer Mn. Further, the first conductive line Mn is electrically connected to the first pad P1 through a first via Vn and a first landing port Ln of the first conductive pillar CP1, and electrically connected to the second pad P2 through a first via Vn and a first landing port Ln of the second conductive pillar CP2, as shown in FIG. 2. Each of the first pads P1 in the first row R1 in the second group G2 of the first array A1 is electrically connected to one of the second pads P2 in the first row R1 in the second group G2 of the second array A2 by one of the second conductive lines in the second layer. In such embodiments, the second layer is disposed under the first layer, and the second conductive lines are the Mn−1 layer. Further, the second conductive line Mn−1 is electrically connected to the first pad P1 through a first via Vn, a first landing port Ln, a second via Vn−1 and a second landing port Ln−1 of the first conductive pillar CP1, and electrically connected to the second pad P2 through a first via Vn, a first landing port Ln, a second via Vn−1 and a second landing port Ln−1 of the second conductive pillar CP2, as shown in FIG. 2. Each of the first pads P1 in the first row R1 in the $n^{th}$ group Gn of the first array A1 is electrically connected to one of the second pads P2 in the first row R1 in the $n^{th}$ group Gn of the second array A2 by one of the $n^{th}$ conductive lines in the $n^{th}$ layer. In such embodiments, the $n^{th}$ layer is lowest layer, and the $n^{t}h$ conductive lines are the lowest metallization layer M1. Further, the $n^{th}$ conductive line M1 is electrically connected to the first pad P1 through a first via Vn, a first landing port Ln, a second via Vn−1, a second landing port Ln−1, an $n^{th}$ via V1 and an $n^{th}$ landing port L1 of the first conductive pillar CP1, and electrically connected to the second pad P2 through a first via Vn, a first landing port Ln, a second via Vn−1, a second landing port Ln−1, an $n^{th}$ via V1 and an $n^{th}$ landing port L1 of the second conductive pillar CP2, as shown in FIG. 2. In some embodiments, a quantity of the metallization layers is equal to a quantity of the groups.

It should be noted that each of the first conductive pillars CP1 may have a functional portion and a dummy portion, and each of the second conductive pillars CP2 may have a functional portion and a dummy portion. As shown in FIG. 2, because the first conductive line Mn is electrically connected to the first pad P1 through the first via Vn and the first landing port Ln of the first conductive pillar CP1, and electrically connected to the second pad P2 through the first via Vn and the first landing port Ln of the second conductive pillar CP2, the first vias Vn and the first landing ports Ln in the first and second conductive pillars CP1 and CP2 are referred to as the functional portions. In contrast to the functional portion (i.e. the first vias Vn and the first landing ports Ln), the second via Vn−1, the second landing port Ln−1, the $n^{th}$ via V1, and the $n^{th}$ landing port L1 are referred to as the dummy portion. Similarly, because the second conductive line Mn−1 is electrically connected to the first pad P1 through the first via Vn, the first landing port Ln, the second via Vn−1 and the second landing port Ln−1 of the first conductive pillar CP1, and electrically connected to the second pad P2 through the first via Vn, the first landing port Ln, the second via Vn−1 and the second landing port Ln−1 of the second conductive pillar CP2, the first vias Vn, the first landing ports Ln, the second vias Vn−1 and the second landing ports Ln−1 in the first and second conductive pillars CP1 and CP2 are referred to as the functional portion. In contrast to the functional portion (i.e. the first vias Vn, the first landing ports Ln, the second vias Vn−1 and the second landing ports Ln−1), the third via Vn−2, the third landing port Ln−2, the $n^{th}$ via V1, and the $n^{th}$ landing port L1 are referred to as the dummy portion. Referring to the $n^{th}$ conductive line M1, because the $n^{th}$ conductive line M1 is electrically connected to the first pad P1 through the first via Vn, the first landing port Ln, the second via Vn−1, the second landing port Ln−1, the $n^{th}$ via V1 and the $n^{th}$ landing port L1 of the first conductive pillar CP1, and electrically connected to the second pad P2 through the first via Vn, the first landing port Ln, the second via Vn−1, the second landing port Ln−1, the $n^{th}$ via V1 and the $n^{h}$ landing port L1 of the second conductive pillar CP2, all of the vias (including the first vias Vn, the second vias Vn−1 and the $n^{th}$ vias V1) and all of the landing ports (including the first landing ports Ln, the second landing ports Ln−1 and the $n^{th}$ landing ports L1) are referred to as the functional portion.

Accordingly, although each of the first conductive pillars CP1 may include a same height, heights of the functional portions of the first conductive pillars CP1 in different groups G1, G2 and Gn are different from each other, and heights of the functional portions of the second conductive pillars CP2 in different groups G1, G2 and Gn are different from each other. Additionally, heights of the functional portions of the first conductive pillars CP1 and height of the functional portion of the second conductive pillars CP2 in the same group are the same.

Referring to FIG. 3, each of the first pads P1 in the second row R2 in the first group G1 of the first array A1 is electrically connected to one of the second pads P2 in the second row R2 in the first group G1 of the second array A2 by one of the first conductive lines M1 in the first layer, and each of the first pads P1 in the $m^{th}$ row Rm in the first group G1 of the first array A1 is electrically connected to one of the second pads P2 in the $m^{th}$ row Rm in the first group G1 of the second array A2 by the first conductive lines Mn in the first layer. As mentioned above, the interconnect structure 100 further includes the first via Vn, the second via Vn−1 and the $n^{th}$ via V1. It should be noted that in FIG. 3, only the functional portions of the first conductive pillars CP1 and the functional portion of the second conductive pillars CP2 are shown.

According to the different embodiments as shown in FIGS. 2 and 3, it should be noted that the first pads P1 and the second pads P2 are electrically connected group-by-group. The first pads P1 and the second pads P2 in different groups, including those in the same row, are not electrically connected, as shown in FIG. 2. Further, in the same group, the first pads P1 and the second pads P2 are electrically connected row-by-row through the conductive lines in the same layer.

Figure 4:
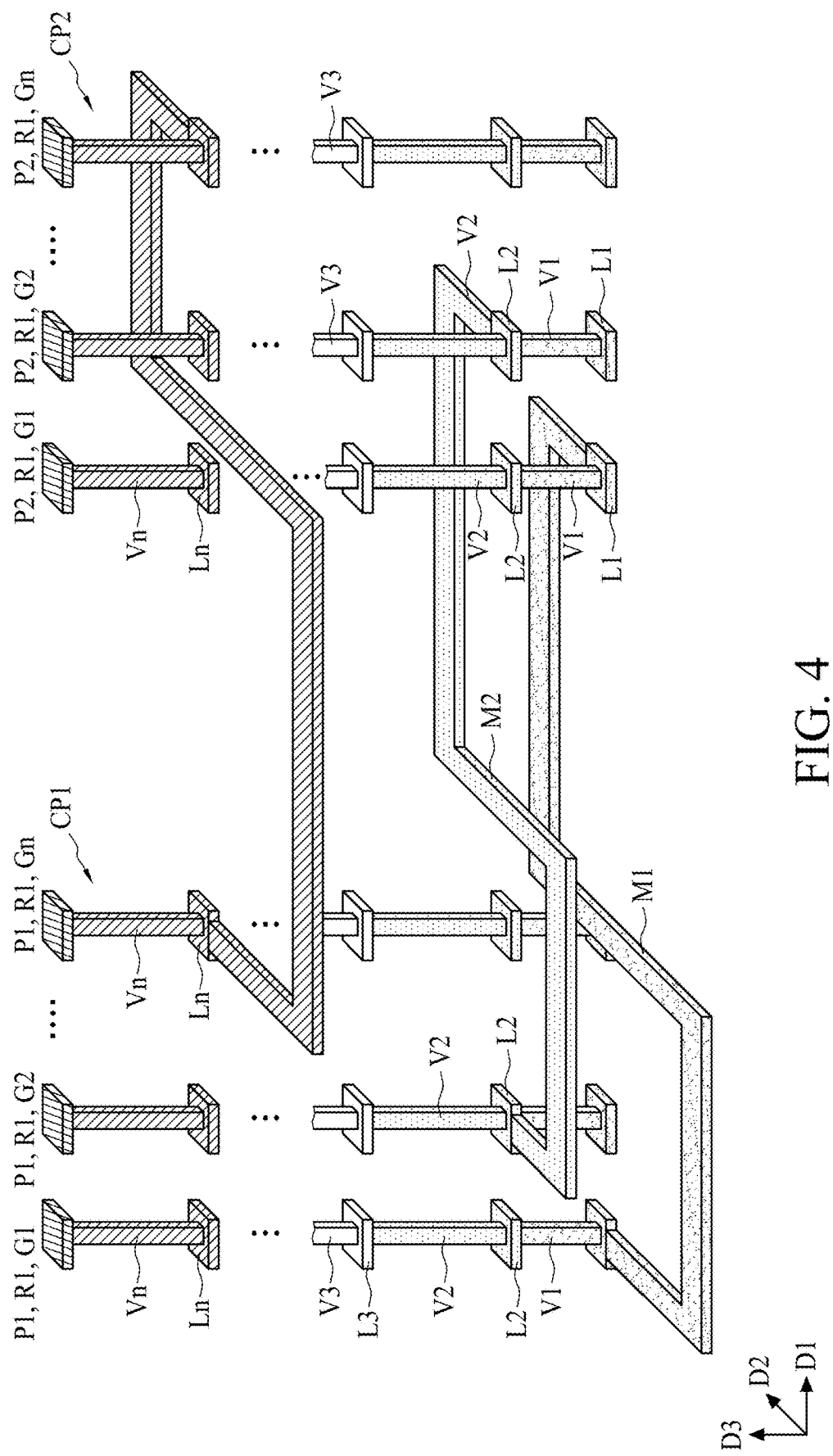
FIG. 4 is a perspective view illustrating a portion of an interconnect structure for a semiconductor structure according to aspects of the present disclosure.

Referring to FIG. 4, in some embodiments, each of the first pads P1 in the first row R1 in the first group G1 of the first array A1 is electrically connected to one of the second pads P2 in the first row R1 in the first group G1 of the second array A2 by one of the first conductive lines in the first layer. In some embodiments, the first conductive lines are the lowest metallization layer M1. The first conductive line M1 is electrically connected to the first pad P1 through a first landing port L1, a first via V1, a second landing port L2, a second via V2, an $n^{th}$ landing port Ln and an $n^{th}$ via Vn of the first conductive pillar CP1, and electrically connected to the second pad P2 through a first landing port L1, a first via V1, a second landing port L2, a second via V2, an $n^{th}$ landing port Ln and $n^{th}$ via Vn of the second conductive pillar CP2, as shown in FIG. 4. Each of the first pads P1 in the first row R1 in the second group G2 of the first array A1 is electrically connected to one of the second pads P2 in the first row R1 in the second group G2 of the second array A2 by one of the second conductive lines in the second layer. In such embodiments, the second layer is disposed over the first layer, and the second conductive lines are the M2 layer. The second conductive line M2 is electrically connected to the first pad P1 through a second landing port L2, a second via V2, an $n^{th}$ landing port Ln and an $n^{th}$ via Vn of the first conductive pillar CP1, and electrically connected to the second pad P2 through a second landing port L2, a second via V2, an $n^{th}$ landing port Ln and $n^{th}$ via Vn of the second conductive pillar CP2, as shown in FIG. 4. Each of the first pads P1 in the first row in the $n^{th}$ group Gn of the first array A1 is electrically connected to one of the second pads P2 in the first row R1 in the $n^{th}$ group Gn of the second array A2 by one of the $n^{th}$ conductive lines in the $n^{th}$ layer. In such embodiments, the $n^{th}$ layer is upper most layer, and the $n^{th}$ conductive lines are the uppermost metallization layer Mn. The $n^{th}$ conductive line Mn is electrically connected to the first pad P1 through an $n^{th}$ landing port Ln and an $n^{th}$ via Vn of the first conductive pillar CP1, and electrically connected to the second pad P2 through an $n^{th}$ landing port Ln and $n^{th}$ via Vn of the second conductive pillar CP2, as shown in FIG. 4. In some embodiments, a quantity of the metallization layers is equal to a quantity of the groups.

As mentioned above, each of the first conductive pillars CP1 may have a functional portion and a dummy portion, and each of the second conductive pillars CP2 may have a functional portion and a dummy portion. As shown in FIG. 4, because the first conductive line M1 is electrically connected to the first pad P1 through the first landing port L1, the first via V1, the second landing port L2, the second via V2, the $n^{th}$ via Vn and the $n^{th}$ landing port Ln of the first conductive pillar CP1, and electrically connected to the second pad P2 through the first landing port L1, the first via V1, the second landing port L2, the second via V2, the $n^{th}$ landing port Ln and the $n^{th}$ via Vn of the second conductive pillar CP2, all of the vias (including the first vias V1, the second vias V2 and the $n^{th}$ vias Vn) and all of the landing ports (including the first landing ports L1, the second landing ports L2 and the $n^{th}$ landing ports Ln) are referred to as the functional portion. Similarly, because the second conductive line M2 is electrically connected to the first pad P1 through the second landing port 2, the second via V2, the $n^{th}$ landing port Ln and the $n^{th}$ via Vn of the first conductive pillar CP1, and electrically connected to the second pad P2 through the second landing port L2, the second via V2, the $n^{th}$ landing port Ln and the $n^{th}$ via Vn of the second conductive pillar CP2, the second land ports L2, the second vias V2, the $n^{th}$ vias Vn and the $n^{th}$ landing ports Ln in the first and second conductive pillars CP1 and CP2 are referred to as the functional portion. In contrast to the functional portion, the first vias V1 and the first landing ports L1 are referred to as the dummy portion. Because the $n^{th}$ conductive line Mn is electrically connected to the first pad P1 through the $n^{th}$ landing port Ln and the $n^{th}$ via Vn of the first conductive pillar CP1, and electrically connected to the second pad P2 through the $n^{th}$ lading port Ln and the $n^{th}$ via Vn of the second conductive pillar CP2, the $n^{th}$ vias Vn and the $n^{th}$ landing ports Ln in the first and second conductive pillars CP1 and CP2 are referred to as the functional portion. In contrast to the functional portion (i.e. the $n^{th}$ vias Vn and the $n^{th}$ landing ports Ln), other vias and landing ports of the first and second conductive pillars CP1 and CP2 are referred to as dummy portions.

Accordingly, although each of the first conductive pillars CP1 may include a same height, heights of the functional portions of the first conductive pillars CP1 in different groups G1, G2 and Gn are different from each other, and heights of the functional portions of the second conductive pillars CP2 in different groups G1, G2 and Gn are different from each other. Additionally, heights of the functional portions of the first conductive pillars CP1 and height of the functional portion of the second conductive pillars CP2 in the same group are the same.

According to the different embodiments as shown in FIGS. 2 and 4, it should be noted that the first pads P1 and the second pads P2 are electrically connected group-by-group. The first pads P1 and the second pads P2 in different groups, including those in the same row, are not electrically connected. In contrast, the electrical connection between the first pads P1 and the second pads P2 in the individual groups are achieved by different conductive lines in different layers.

Figure 5:
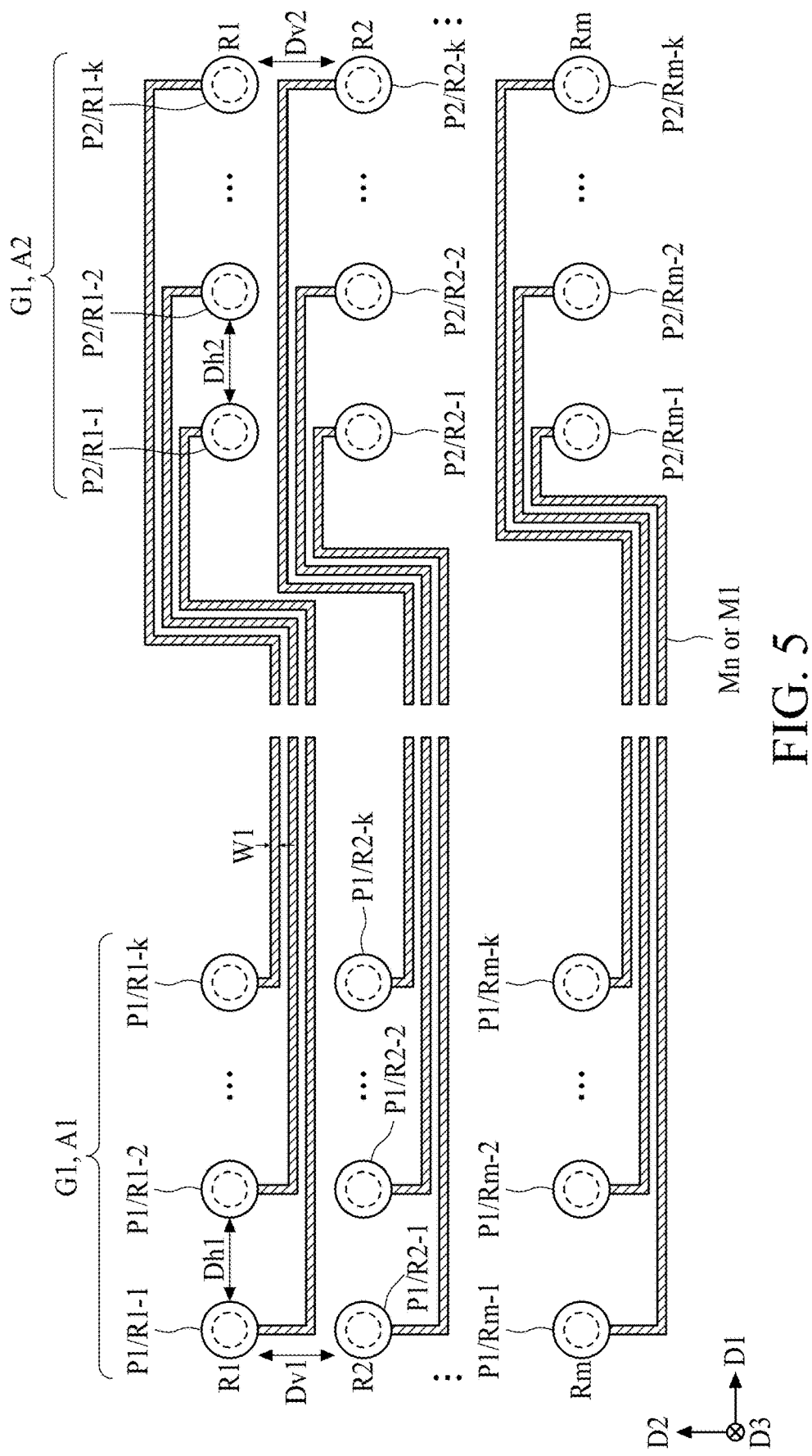
FIG. 5 is a schematic view illustrating a portion of an interconnect structure for a semiconductor structure according to aspects of the present disclosure.

FIG. 5 is a schematic view of a portion of the interconnect structure according to aspects of the present disclosure. In some embodiments, each of the first pads P1 in the first row R1 in the first group G1 of the first array A1 is electrically connected to one of the second pads P2 in the first row R1 in the first group G1 of the second array A2 by one of the first conductive lines Mn (or M1) in the first layer. Each of the first pads P1 in the second row R2 in the first group G1 of the first array A1 is electrically connected to one of the second pads P2 in the second row R2 in the first group G1 of the second array A2 by one of the first conductive lines Mn (or M1) in the first layer. Each of the first pads P1 in the $m^{th}$ row Rm in the first group G1 of the first array A1 is electrically connected to one of the second pads P2 in the $m^{th}$ row Rm in the first group G1 of the second array A2 by one of the first conductive lines Mn (or M1) in the first layer.

Figure 6:
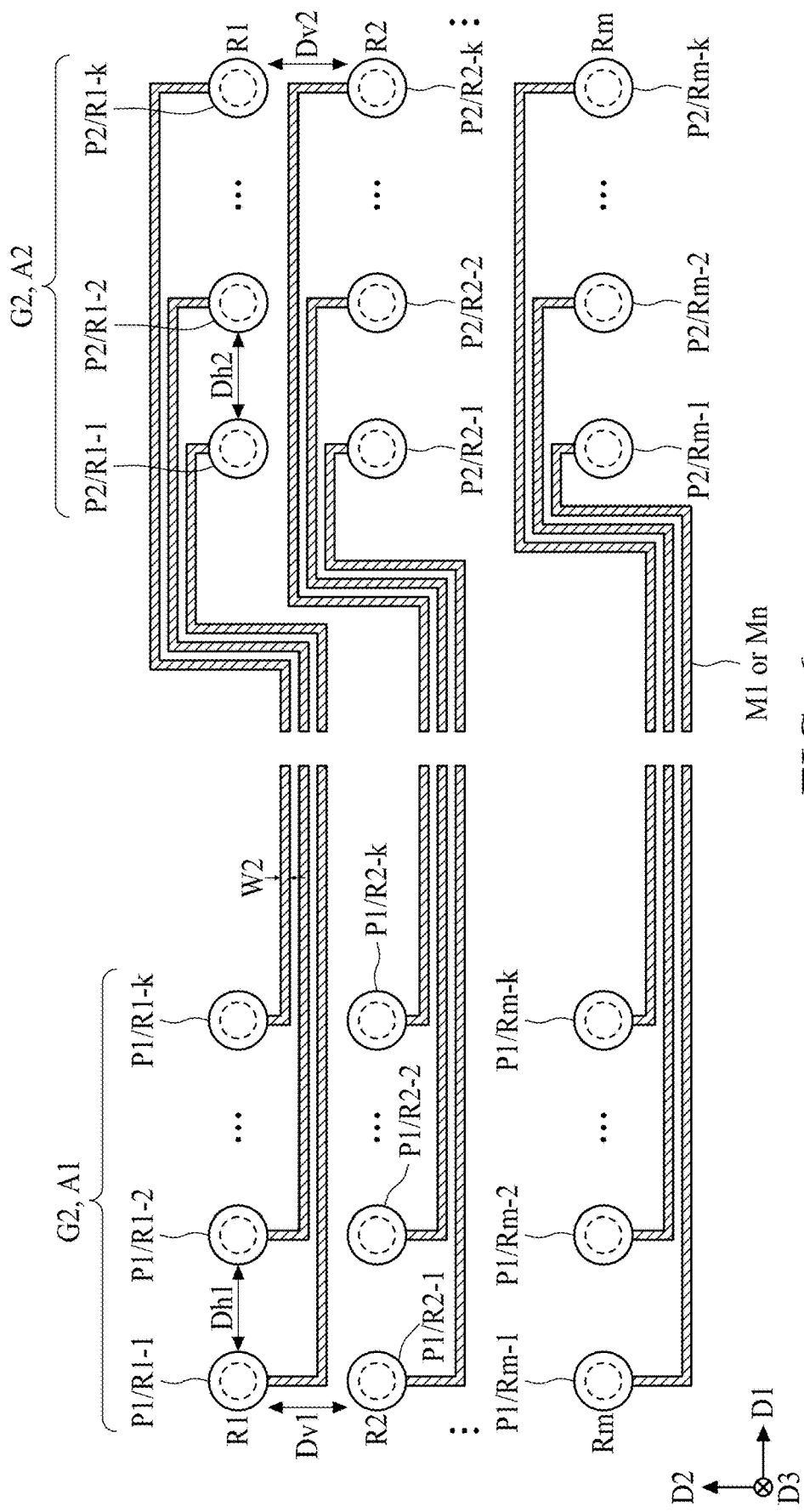
FIG. 6 is a schematic view illustrating a portion of an interconnect structure for a semiconductor structure according to aspects of the present disclosure.

Referring to FIG. 6, each of the first pads P1 in the first row R1 in the second group G2 of the first array A1 is electrically connected to one of the second pads P2 in the first row R1 in the second group G2 of the second array A2 by one of the second conductive lines Mn−1 (or M2) in the second layer. Each of the first pads P1 in the second row R2 in the second group G2 of the first array A1 is electrically connected to one of the second pads P2 in the second row R2 in the second group G2 of the second array A2 by one of the second conductive lines Mn−1 (or M2) in the second layer. Each of the first pads P1 in the $m^{th}$ row Rm in the second group G2 of the first array A1 is electrically connected to one of the second pads P2 in the $m^{th}$ row Rm in the second group G2 of the second array A2 by one of the second conductive lines Mn−1 (or M2) in the second layer.

Similarly, each of the first pads P1 in the first row R1 in the $n^{th}$ group Gn of the first array A1 is electrically connected to one of the second pads P2 in the first row R1 in the $n^{th}$ group Gn of the second array A2 by the $n^{th}$ conductive lines M1 (or Mn) in the $n^{th}$ layer. Each of the first pads P1 in the second row R2 in the $n^{th}$ group Gn of the first array A1 is electrically connected to one of the second pads P2 in the second row R2 in the $n^{th}$ group Gn of the second array A2 by one of the $n^{th}$ conductive lines M1 (or Mn) in the $n^{th}$ layer. Each of the first pads P1 in the $m^{th}$ row Rm in the $n^{th}$ group Gn of the first array A1 is electrically connected to one of the second pads P2 in the $m^{th}$ row Rm in the $n^{th}$ group Gn of the second array A2 by one of the $n^{th}$ conductive lines M1 (or Mn) in the $n^{th}$ layer.

According to the embodiment as shown in FIGS. 5 and 6, it should be noted that the first pads P1 and the second pads P2 are electrically connected group-by-group. The first pads P1 and the second pads P2 in the same group, including those in different rows, are electrically connected row-by-row by one of the conductive lines in the same layer. In contrast, the electrical connections between the first pads P1 and the second pads P2 in the individual groups are achieved by different conductive lines in different layers.

As mentioned above, the first pads P1 in adjacent rows are separated from each other by the first vertical distance Dv1, and the second pads P2 in adjacent rows are separated from each other by the second vertical distance Dv2. Further, each of the first conductive lines Mn (or M1) has a width W1, and each of the second conductive lines Mn−1 (or M2) has a width W2. Similarly, each of the $n^{th}$ conductive lines M1 (or Mn) has a width Wn. In some embodiments, the widths W1, W2 and Wn are the same. In some embodiments, a sum of widths W1 of the first conductive lines Mn (or M1) electrically connecting the first pads P1 and the second pads P2 in the same row is less than the first vertical distance Dv1 and the second vertical distance Dv2, as shown in FIG. 5. A sum of widths W2 of the second conductive lines Mn−1 (or M2) electrically connecting the first pads P1 and the second pads P2 in the same row is less than the first vertical distance Dv1 and the second vertical distance Dv2, as shown in FIG. 6. Similarly, a sum of widths Wn of the $n^{th}$ conductive lines M1 (or Mn) electrically connecting the first pads P1 and the second pads P2 in the same row is less than the first vertical distance Dv1 and the second vertical distance Dv2.

Further, in some embodiments, a sum of widths W1 of the first conductive lines Mn (or M1) electrically connecting the first pads P1 and the second pads P2 in the same row is less than the spacing distance Ds (shown in FIG. 1). A sum of widths W2 of the second conductive lines Mn−1 (or M2) electrically connecting the first pads P1 and the second pads P2 in the same row is less than the spacing distance Ds. Similarly, a sum of widths Wn of the $n^{th}$ conductive lines M1 (or Mn) electrically connecting the first pads P1 and the second pads P2 in the same row is less than the spacing distance Ds. In some embodiments, a sum of widths W1, W2 and Wn of all the conductive lines Mn, Mn−1 and M1 (or M1, M2 and Mn) is less than the spacing distance Ds.

Referring to FIGS. 5 and 6, in some embodiments, the first pads P1 in each row of each group includes a first subordinate pad P1/R1-1, a second subordinate pad P1/R1-2, and a $k^{th}$ subordinate pad P1/R1-k sequentially arranged along the first direction D1, the second pads P2 in each row of each group include a first subordinate pad P2/R1-1, a second subordinate pad P2/R1-2, and an $k^{th}$ subordinate pad P2/R1-k sequentially arranged along the first direction D1. In some embodiments, k is an integer equal to or greater than 2. For example, the first pads P1 in the first row R1 of the first group G1 of the first array A1 include a first subordinate pad P1/R1-1, a second subordinate pad P1/R1-2 and a $k^{th}$ subordinate pad P1/R1-k sequentially arranged along the first direction D1. In some embodiments, the first pads P1 in the first array A1 can be defined according to Table 1:

TABLE 1

| G1 | | | G2 | | | Gn | | |
|---|---|---|---|---|---|---|---|---|
| P1/R1-1 | P1/R1-2 | P1/R1-k | P1/R1-1 | P1/R1-2 | P1/R1-k | P1/R1-1 | P1/R1-2 | P1/R1-k |
| P1/R2-1 | P1/R2-2 | P1/R2-k | P1/R2-1 | P1/R2-2 | P1/R2-k | P1/R2-1 | P1/R2-2 | P1/R2-k |
| P1/Rm-1 | P1/Rm-2 | P1/Rm-k | P1/Rm-1 | P1/Rm-2 | P1/Rm-k | P1/Rm-1 | P1/Rm-2 | P1/Rm-k |

For example, the second pads P2 in the first row R1 of the first group G1 of the second array A2 are defined to a first subordinate pad P2/R1-1, a second subordinate pad P2/R1-2 and a $k^{th}$ subordinate pad P2/R1-k sequentially arranged along the first direction D1. In some embodiments, the second pads P2 in the second array A2 can be defined according to Table 2:

TABLE 2

| G1 | | | G2 | | | Gn | | |
|---|---|---|---|---|---|---|---|---|
| P2/R1-1 | P2/R1-2 | P2/R1-k | P2/R1-1 | P2/R1-2 | P2/R1-k | P2/R1-1 | P2/R1-2 | P2/R1-k |
| P2/R2-1 | P2/R2-2 | P2/R2-k | P2/R2-1 | P2/R2-2 | P2/R2-k | P2/R2-1 | P2/R2-2 | P2/R2-k |
| P2/Rm-1 | P2/Rm-2 | P2/Rm-k | P2/Rm-l | P2/Rm-2 | P2/Rm-k | P2/Rm-1 | P2/Rm-2 | P2/Rm-k |

In some embodiments, k is not equal to m, for example, k is less than m, but the disclosure is not limited thereto. In some embodiments, k is not equal to n, for example, k is less than n, but the disclosure is not limited thereto. In some embodiments k is not equal to 1, for example, k is less than 1, but the disclosure is not limited thereto.

In each of the first group G1, the second group G2 and the $n^{th}$ group Gn, the first subordinate pad P1/R1-1 in the first array A1 is electrically connected to the first subordinate pad P2/R1-2 in the second array A2, the second subordinate pad P1/R1-2 in the first array A1 is electrically connected to the second subordinate pad P2/R1-2 in the second array A2, and the $k^{th}$ subordinate pad P1/R1-k in the first array A1 is electrically connected to the $k^{th}$ subordinate pad P2/R1-k in the second array A2.

Figure 7:
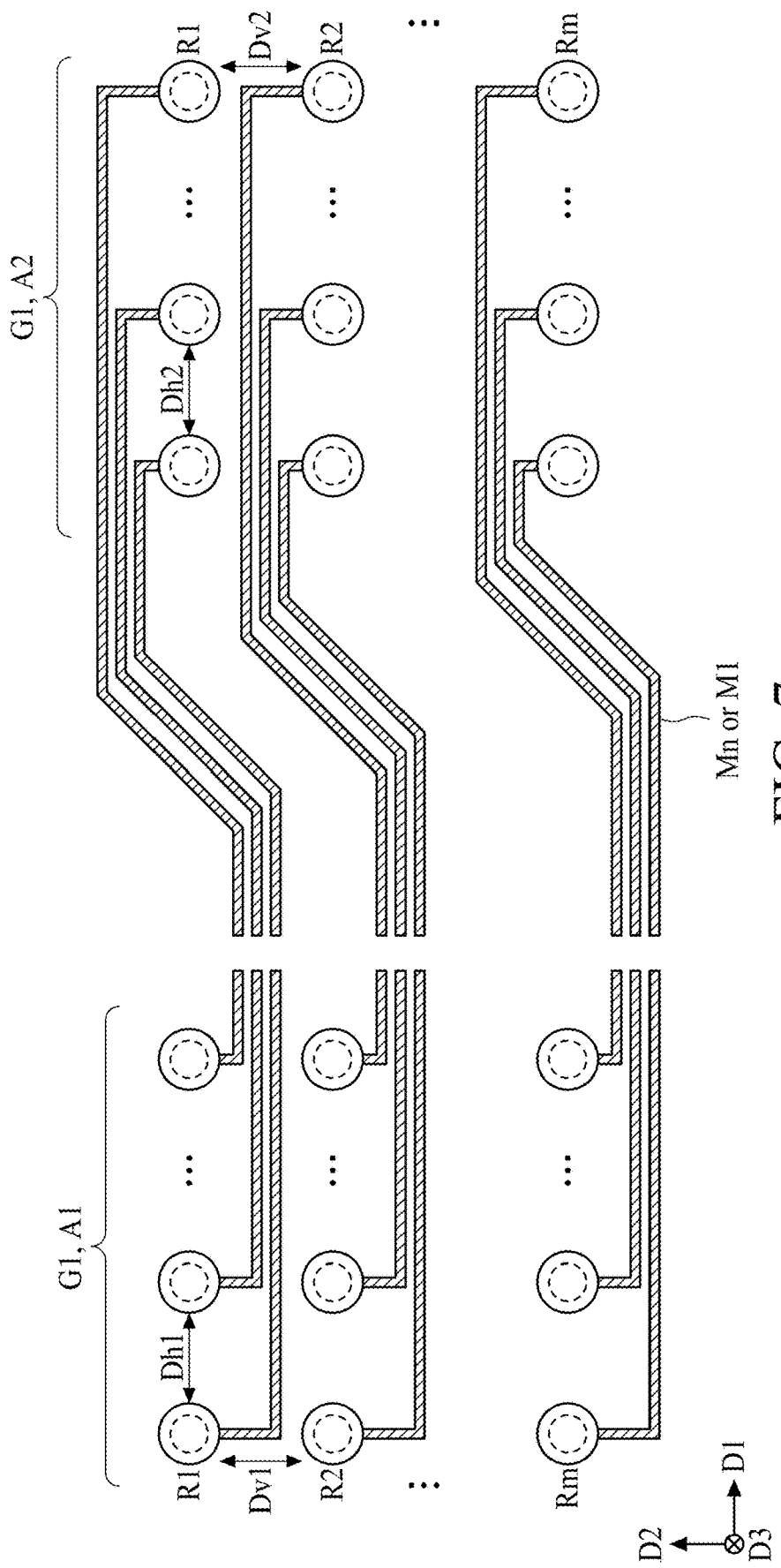
FIG. 7 is a schematic view illustrating a portion of an interconnect structure for a semiconductor structure according to aspects of the present disclosure.

Please refer to FIG. 7, which is a schematic view illustrating a portion of an interconnect structure for a semiconductor structure according to aspects of the present disclosure. In some embodiments, the conductive lines can include patterns having horizontal lines connected to each other by vertical lines, as shown in FIGS. 5 and 6. In other embodiments, the conductive lines can include patterns having horizontal lines connected to each other by slanted lines, as shown in FIG. 7.

Figure 8:
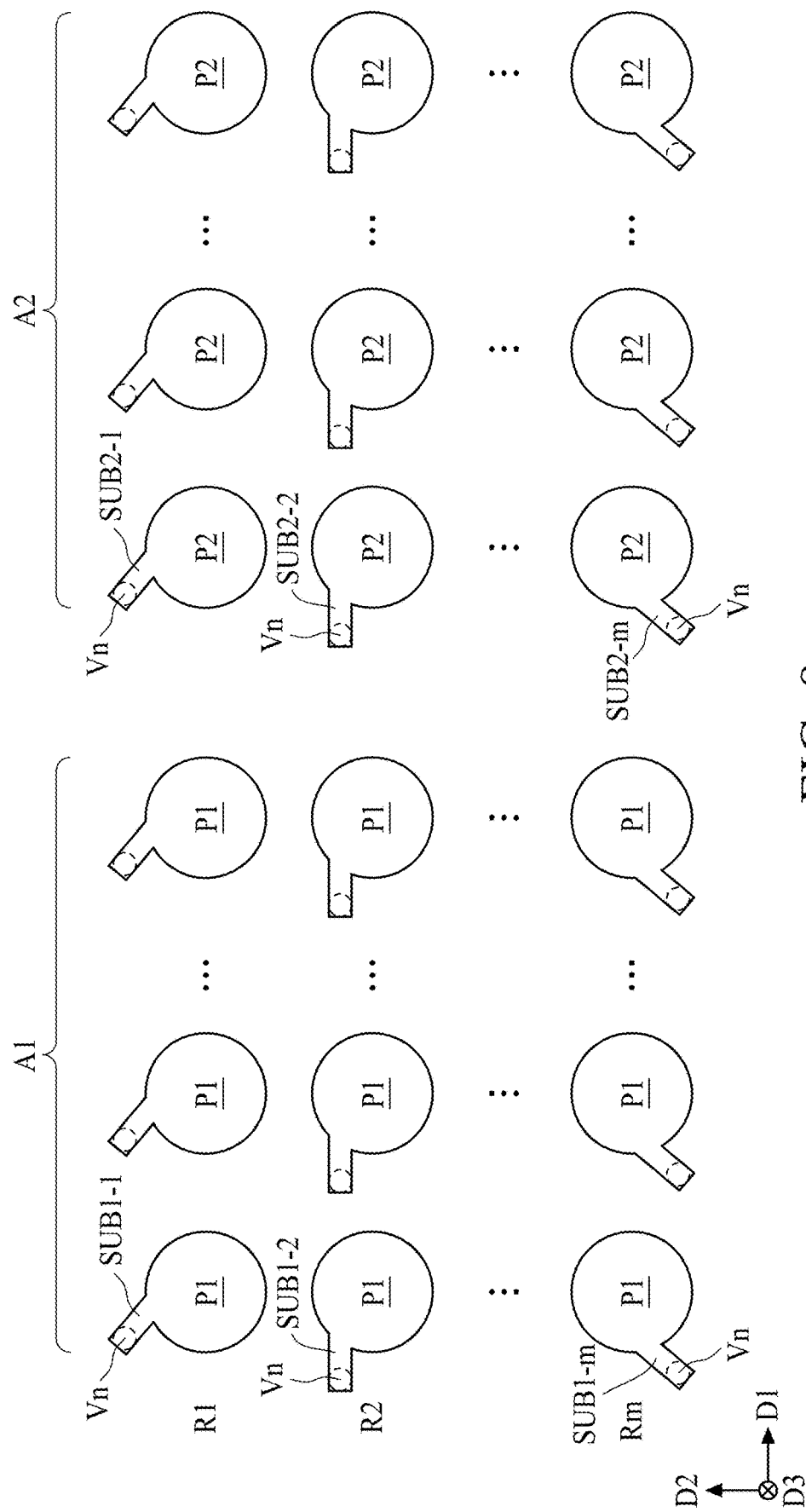
FIG. 8 is a schematic enlarged view illustrating a portion of an interconnect structure for a semiconductor structure according to aspects of the present disclosure.

FIG. 8 is a schematic enlarged view illustrating a portion of an interconnect structure for a semiconductor structure according to aspects of the present disclosure. In some embodiments, at least one of the first pads P1 includes a subsidiary line SUB1-1 extending along a third direction. The third direction can be different from the first direction D1 and the second direction D2, but the disclosure is not limited thereto. For example, the first pads P1 in the same row, such as, for example but not limited thereto, the first row R1 respectively include the subsidiary line SUB1-1. Similarly, at least one of the second pads P2 includes a subsidiary line SUB2-1 extending along a fourth direction. The fourth direction can be different from the first direction D1 and the second direction D2, but the disclosure is not limited thereto. In some embodiments, the third direction and the fourth direction can be the same, but the disclosure is not limited thereto.

Still referring to FIG. 8, in some embodiments, the first pads P1 in different rows have subsidiary lines extending in different directions. For example, the first pads P1 in the first row R1 respectively include the subsidiary line SUB1-1, the first pads P1 in the second row R2 respectively include the subsidiary line SUB1-2, and the first pads P1 in the $m^{th}$ row Rm respectively include the subsidiary line SUB1-m. In some embodiments, extending directions of the subsidiary lines SUB1-1, SUB1-2 and SUB1-m are different from each other, but the disclosure is not limited thereto.

Similarly, in some embodiments, the second pads P2 in different rows have subsidiary lines extending in different directions. For example, the second pads P2 in the first row R1 respectively include the subsidiary line SUB2-1, the second pads P2 in the second row R2 respectively include the subsidiary line SUB2-2, and the second pads P2 in the $m^{th}$ row Rm respectively include the subsidiary line SUB2-m. In some embodiments, extending directions of the subsidiary lines SUB2-1, SUB2-2 and SUB2-m are different from each other, but the disclosure is not limited thereto.

In some embodiments, the subsidiary lines SUB1-m and SUB2-m are formed by a pad layer, which is coupled to the pads, but the disclosure is not limited thereto. In some embodiments, the subsidiary lines SUB1-$m$ and SUB2-$m$ can be formed to provide extra routing resources. For example, the subsidiary lines SUB1-$m$ and SUB2-$m$ can be coupled to the first vias Vn (or the $n^{th}$ via Vn), as shown in FIG. 8. Because extending directions of the subsidiary lines SUB1-1, SUB1-2 and SUB1-$m$ are different from each other, locations of the first vias Vn or the $n^{th}$ vias Vn may be adjusted such that the first vias Vn or the $n^{th}$ vias Vn can be coupled to the subsidiary lines SUB1-1, SUB1-2 and SUB1-$m$. Consequently, spaces between adjacent pairs of vias Vn arranged in the same column may be different from each other. In some embodiments, the subsidiary lines SUB1-$m$ and SUB2-$m$ provide more places for accommodating the vias. In other words, more vertical connections can be obtained.

Figure 9:
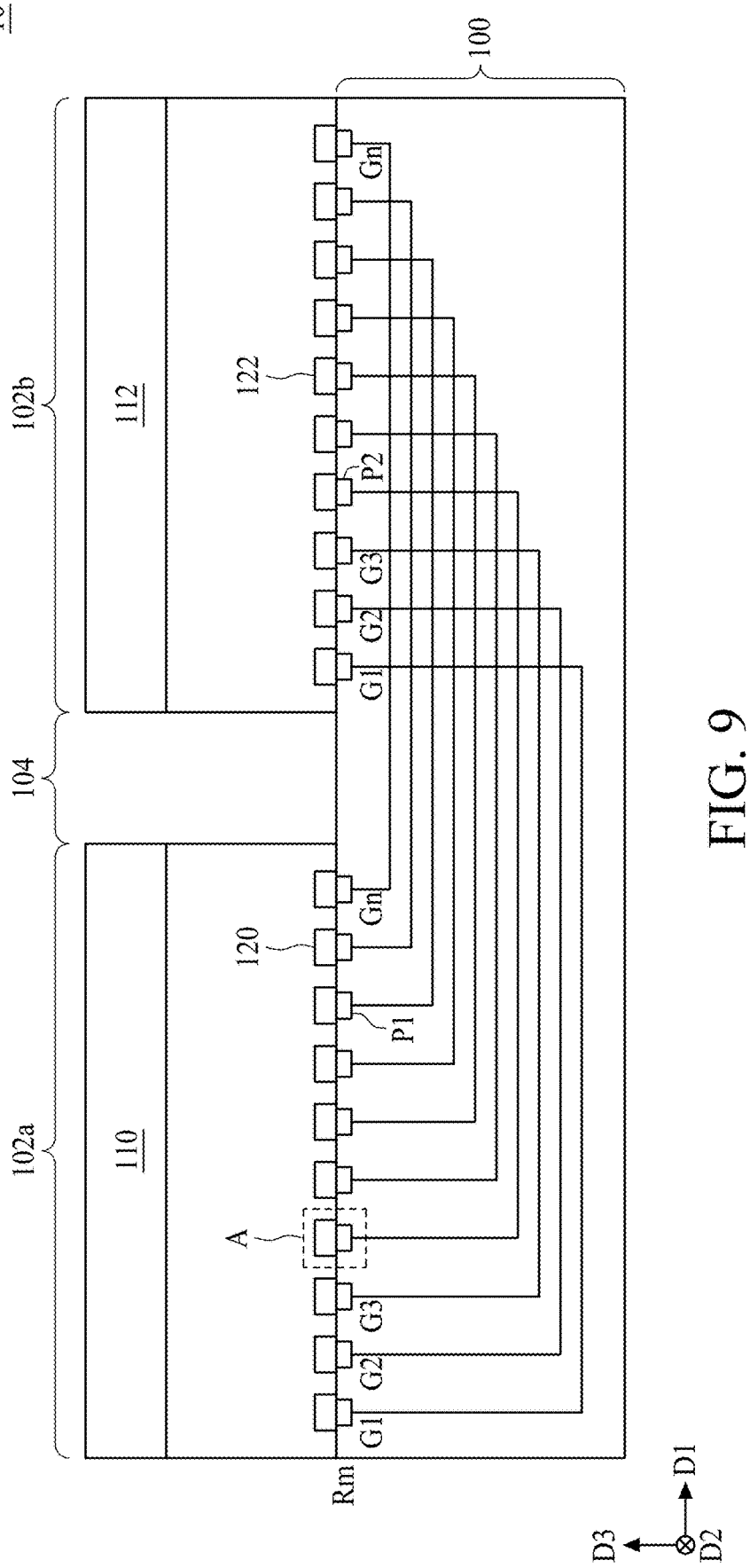
FIG. 9 is a schematic view illustrating a semiconductor structure according to aspects of the present disclosure.

Please refer to FIG. 9, which is a schematic drawing illustrating a semiconductor structure including the interconnect structure according to aspects of the present disclosure. It should be noted that in FIG. 9, in each group G1, G2 and Gn, only pair of one first/second pads P1/P2 are represented, and only the functional portions of the first conductive pillars CP1 and the functional portion of the second conductive pillars CP2 are shown. Further, as shown in FIG. 9, the first/second pads P1/P2 are disposed over the first layer, the second layer and the $n^{th}$ layer. In some embodiments, the interconnect structure 100 can be coupled to two workpieces, such as a first die 110 and a second die 112, such that a semiconductor structure 10 is obtained. In another embodiments, the interconnect structure 100 can be coupled to a first package 110 and a second package 112. In other embodiments, the interconnect structure 100 can be coupled to a package, a die or a wafer having a first region 110 and a second region 112. In some embodiments, the first die, the first package or the first region 110 includes a plurality of die pads 120, and the second die, the second package or the second region 112 includes a plurality of die pads 122. In some embodiments, each of the first pads P1 is electrically connected to one of the die pads 120, and each of the second pads P2 is electrically connected to one of the die pads 122. In some embodiments, each of the first pads P1 is bonded to one of the die pads 120, and each of the second pads P2 is bonded to one of the die pads 122, such that the first die 110 and the second die 112 are bonded to the interconnect structure 100, as shown in FIG. 2. In some embodiments, the bonding of the die pads 120 and 122 to the first/second pads P1/P2 includes hybrid bonding, but the disclosure is not limited thereto. As shown in FIG. 9, by bonding the die pads 120/122 to the first/second pads P1/P2, connections between the first die 110 and the second die 112 (or the first package and the second package, or the first region and second region of one wafer, one die or one package) are achieved.

Figure 10:
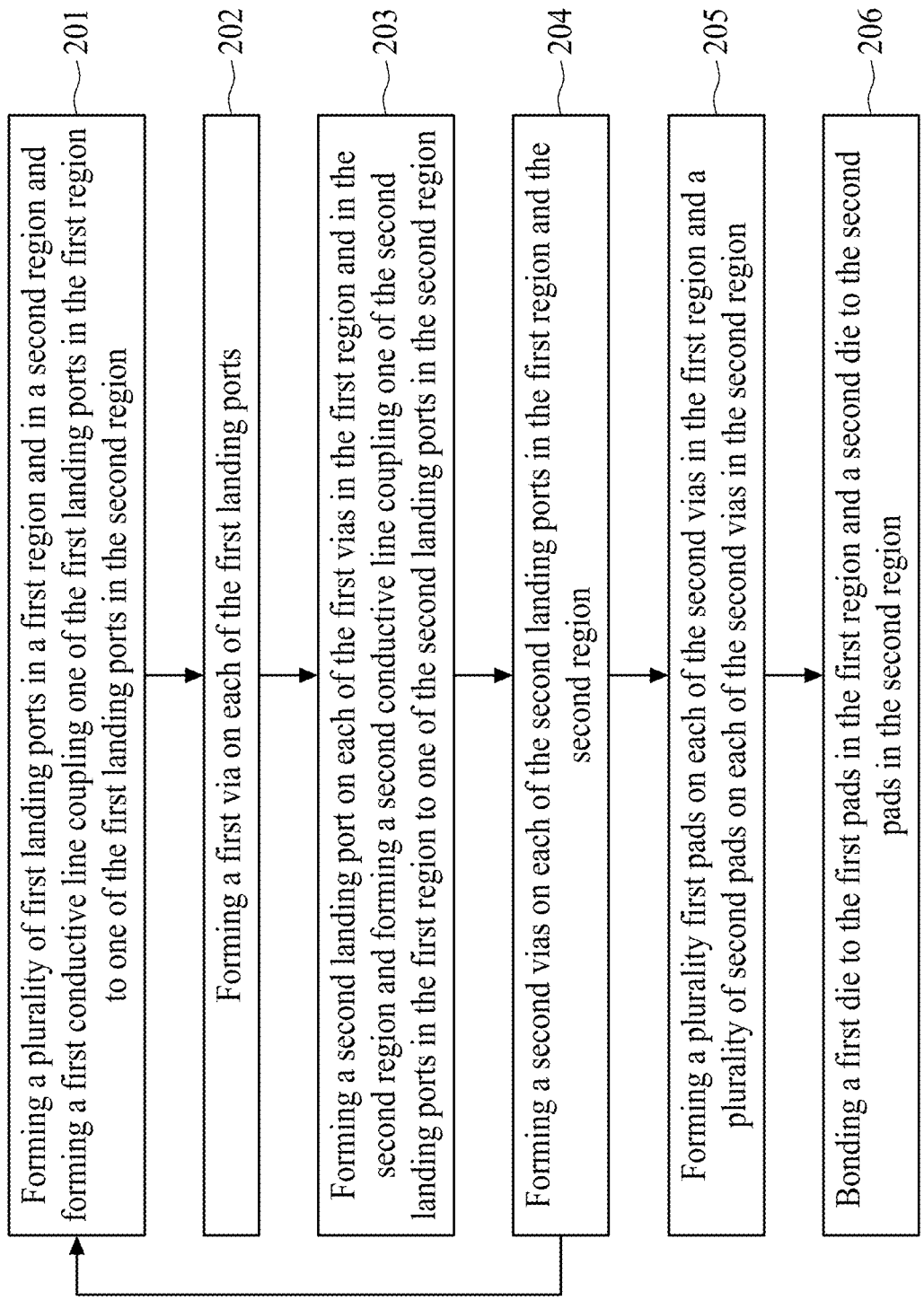
FIG. 10 is a flowchart of a method for forming a semiconductor structure according to aspects of the present disclosure.

Referring to FIG. 10, which is a flowchart representing a method for forming a semiconductor structure 20 according to aspects of the present disclosure. The method 20 includes a number of operations (201, 202, 203, 204, 205, and 206). The method for forming the semiconductor structure 20 will be further described according to one or more embodiments. It should be noted that the operations of the method for forming the semiconductor structure 20 may be rearranged or otherwise modified within the scope of the various aspects. It should further be noted that additional processes may be provided before, during, and after the method 20, and that some other processes may only be briefly described herein. Thus other implementations are possible within the scope of the various aspects described herein.

Figure 11A:
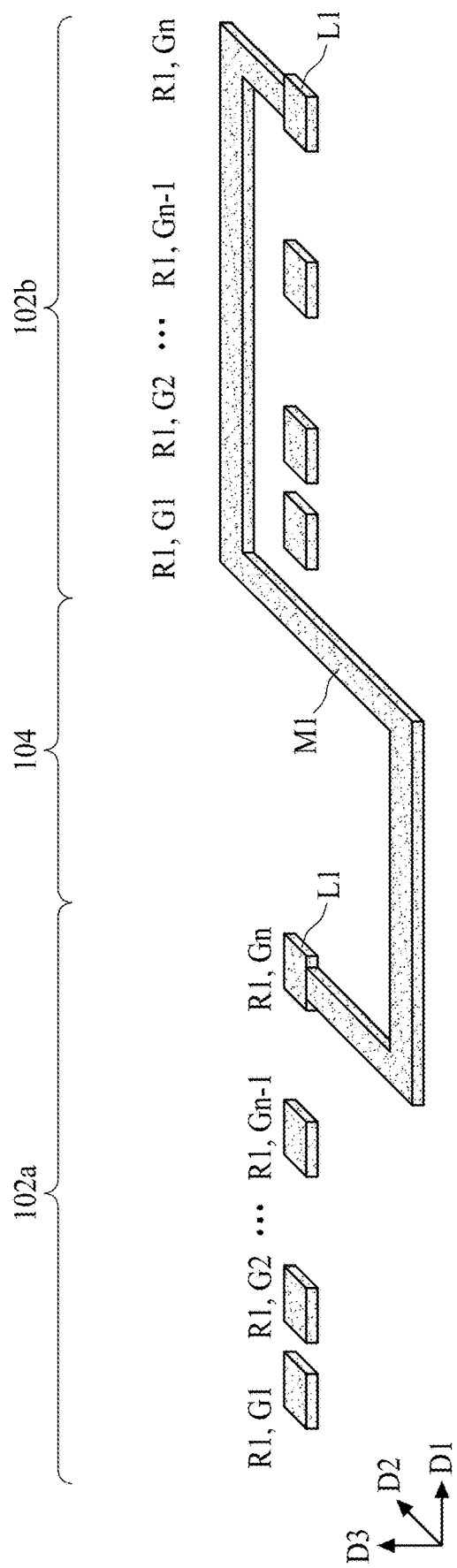
FIGS. 11A to 11F are schematic views illustrating a semiconductor structure at various fabrication stages constructed according to aspects of the present disclosure in one or more embodiments.

At operation 201, a plurality of first landing ports L1 is formed in a first region 102$a$ and in a second region 102$b$. Also at operation 201, a first conductive line M1 is formed to couple one of the first landing ports L1 in the first region 102$a$ to one of the first landing ports L1 in the second region 102$b$. In some embodiments, a carrier (not shown) can be provided. In some embodiments, the carrier can be defined to the first region 102$a$, the second region 102$b$ and a spacing region 104 separating the first region 102$a$ from the second region 102$b$. A first dielectric layer (not shown) can be formed over the carrier. A plurality of first landing port L1 and at least a first conductive line M1 are simultaneously formed, as shown in FIG. 11A. In some embodiments, the first landing ports L1 are formed in the first region 102$a$ and the second region 102$b$. The first landing ports L1 in the first region 102$a$ can be arranged along a first direction D1 to form a plurality of rows R1, R2 and Rm, and arranged along a second direction D2 to form a plurality of columns C1, C2 and Cl. The arrangement of the first landing ports L1 in the first region 102$a$ can be designed to be similar as the first pad arrangement as mentioned above. Further, the first landing ports L1 in the first region 102$a$ can be grouped into a plurality of groups G1, G2 and Gn. The first landing ports L1 in the second region 102$b$ can be arranged along a first direction D1 to form a plurality of rows R1, R2 and Rm, and arranged along a second direction D2 to form a plurality of columns C1, C2 and Cl. The arrangement of the first landing ports L1 in the second region 102$b$ can be designed to be similar as the second pad arrangement as mentioned above. Further, the first landing ports L1 in the second region 102$b$ can be grouped into a plurality of groups G1, G2 and Gn. In some embodiments, in the first layer, each of the first landing port L1 in the first row R1 in the $n^{th}$ group Gn in the first region 102$a$ is electrically connected to one of the first landing port L1 in the first row R1 in the first group G1 of the second region 102$b$ by the first conductive line M1, as shown in FIG. 11A. Additionally, the first conductive line M1 passes through the spacing region 104.

Figure 11B:
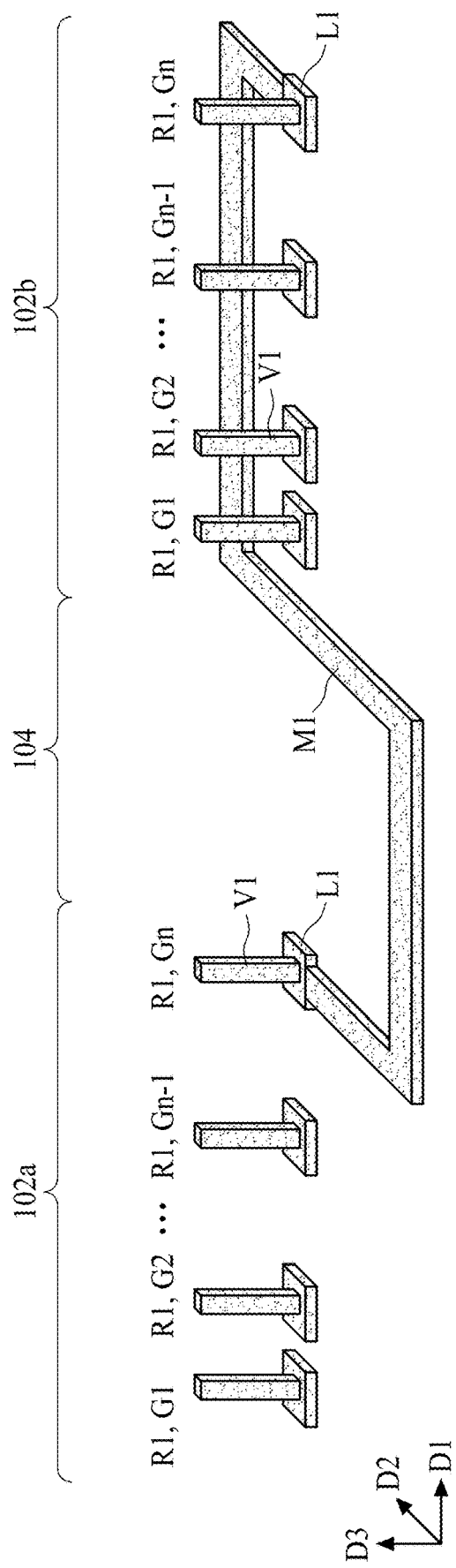

At operation 202, a first via V1 is formed on each of the first landing ports L1. Referring to FIG. 11B, in some embodiments, a plurality of first vias V1 is formed. As shown in FIG. 11B, each of the first vias V1 is formed on one of the first landing ports L1.

Figure 11C:
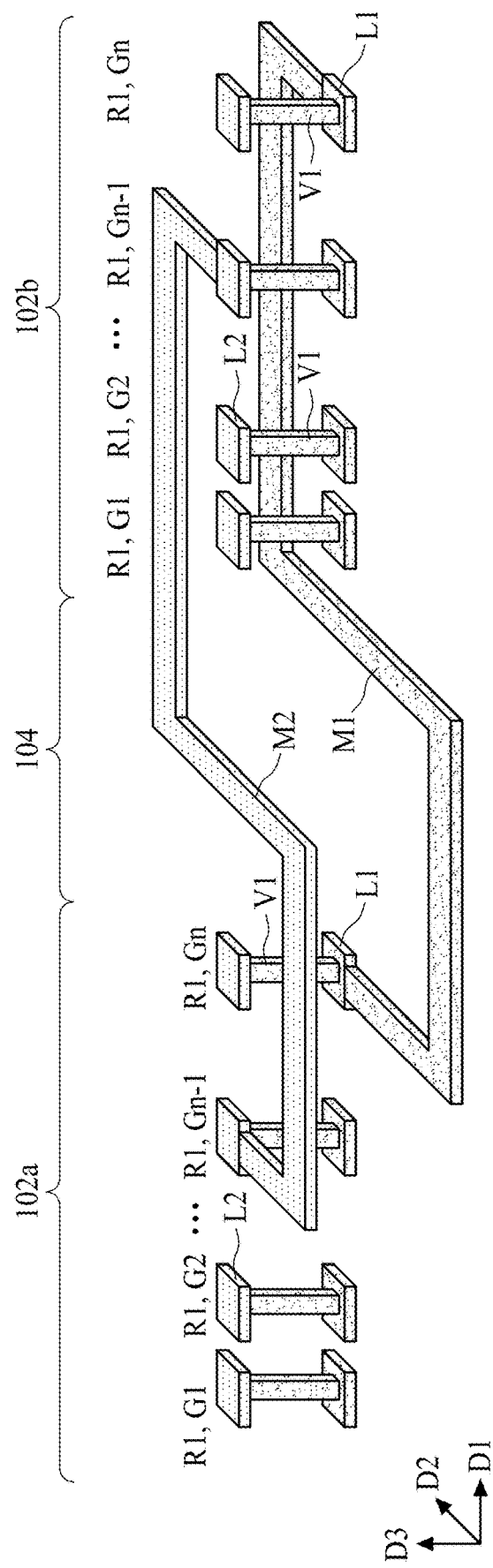

At operation 203, a plurality of second landing ports L2 are formed on each of the first via V1 in the first region 102$a$ and in the second region 102$b$, and a second conductive line M2 is formed to couple one of the second landing ports L2 in the first region 102$a$ to one of the second landing ports L2 in the second region 102$b$. Referring to FIG. 11C, in some embodiments, a plurality of second landing ports L2 and at least a second conductive line M2 are simultaneously formed. As shown in FIG. 11C, each of the second land ports L2 is formed one of the first vias V1. In some embodiments, in the second layer, each of the second landing port L2 in the first row R1 in the n−1$^{th}$ group Gn−1 in the first region 102$a$ is electrically connected to one of the second landing port L2 in the first row R1 in the n−1$^{th}$ group Gn−1 of the second region 102$b$ by the second conductive line M2, as shown in FIG. 11C. Additionally, the second conductive line M2 passes through the spacing region 104.

Figure 11D:
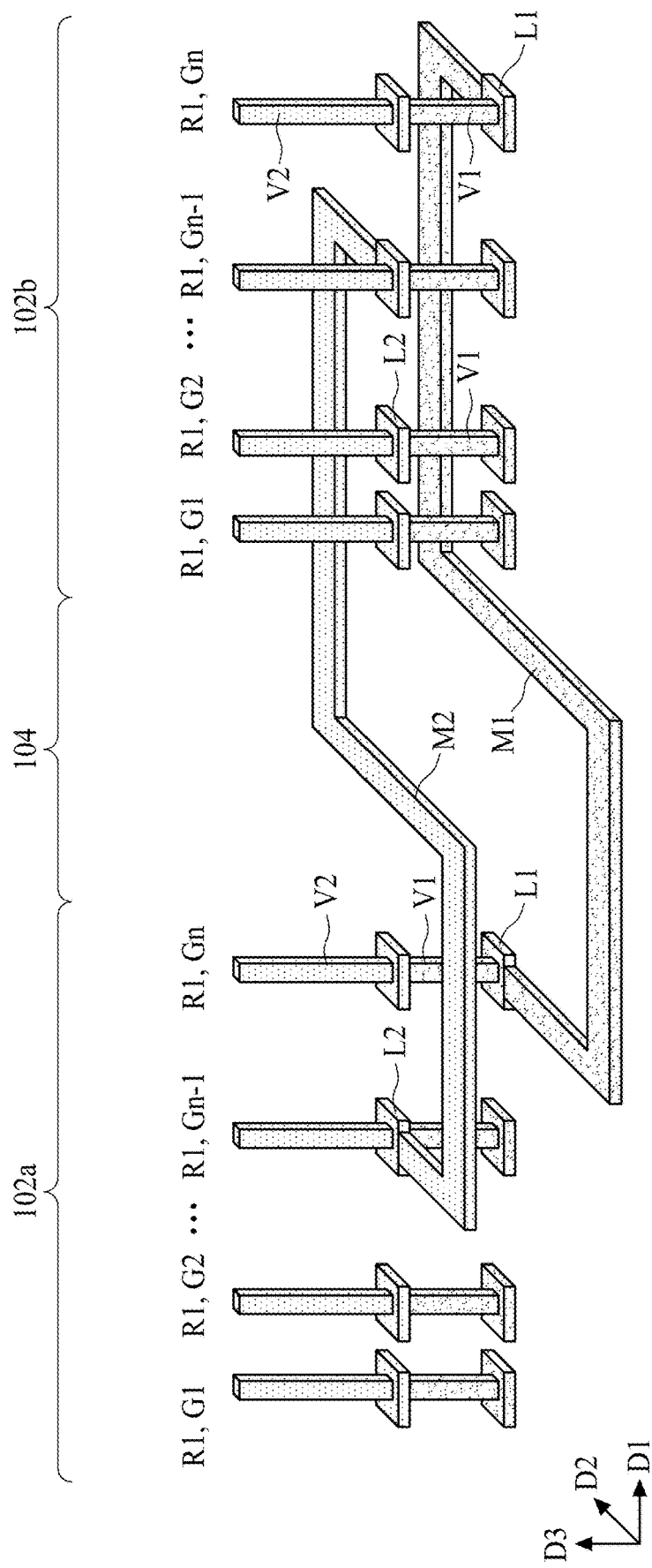

At operation 204, a second via V2 is formed on each of the second landing ports L2. Referring to FIG. 11D, in some embodiments, a plurality of second vias V2 is formed. As shown in FIG. 11D, each of the second vias V2 is formed on one of the second landing ports L2.

Figure 11E:
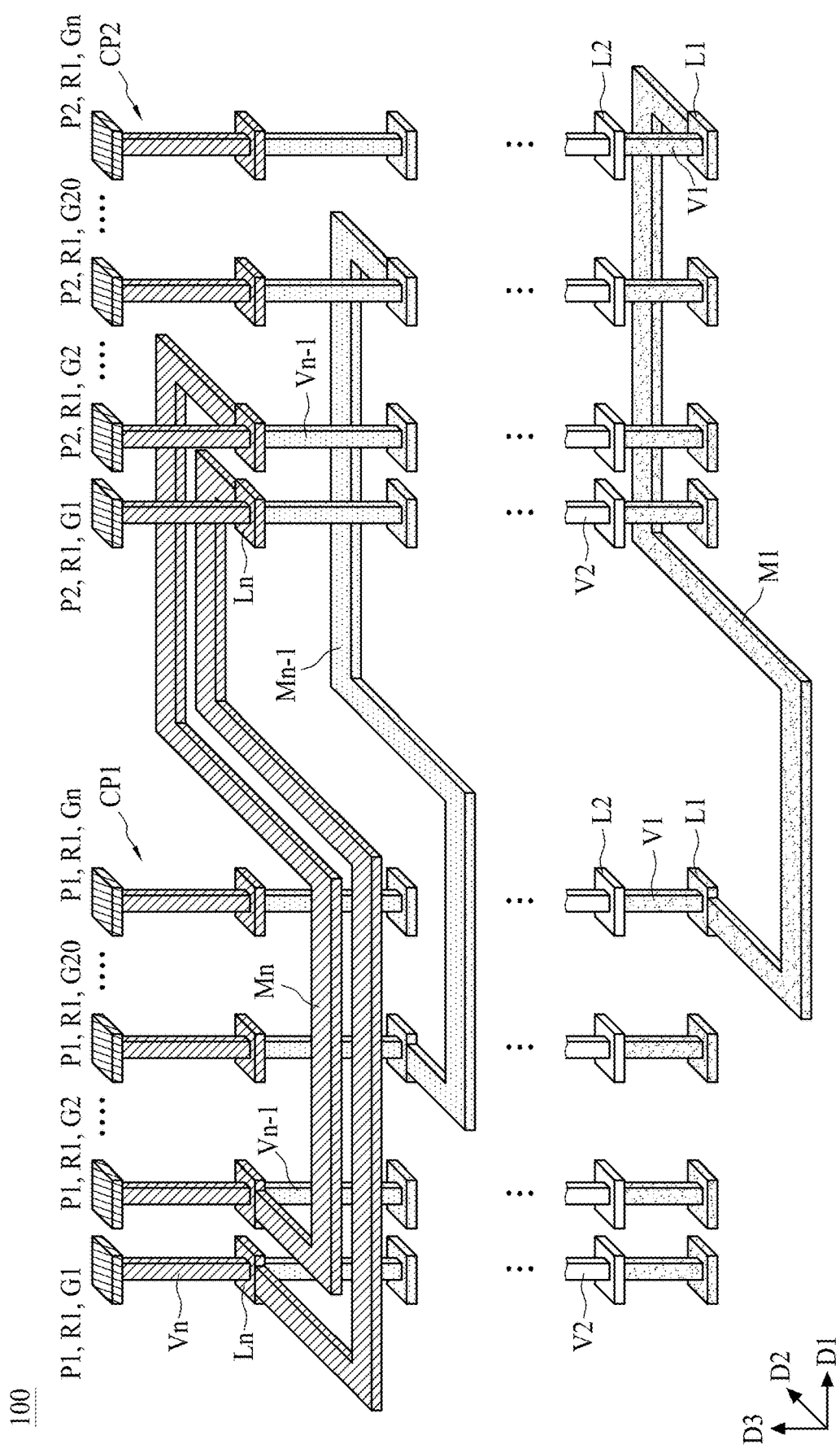

Referring to FIG. 11E, in some embodiments, operations 201 to 204 for forming the landing ports and the conductive lines, and operations for forming the via can be repeated. At operation 205, a plurality of first pads P1 is formed on each of the n$^{th}$ via Vn (i.e. the second vias V2) in the first region 102a and a plurality of second pads P2 on each of the n$^{th}$ vias Vn (i.e., the second vias V2) in the second region 102b. Accordingly, an interconnect structure 100 is obtained, as shown in FIG. 11E. As mentioned above, the interconnect structure 100 includes a plurality of first pads P1 and a plurality of first conductive pillars CP1 in the first region 102a and a plurality of second pads P2 and a plurality of second pillars CP2 in the second region 102b. Details of the interconnect structure 100 can be similar as descriptions mentioned above, therefore those details are omitted in the interest of brevity.

Figure 11F:
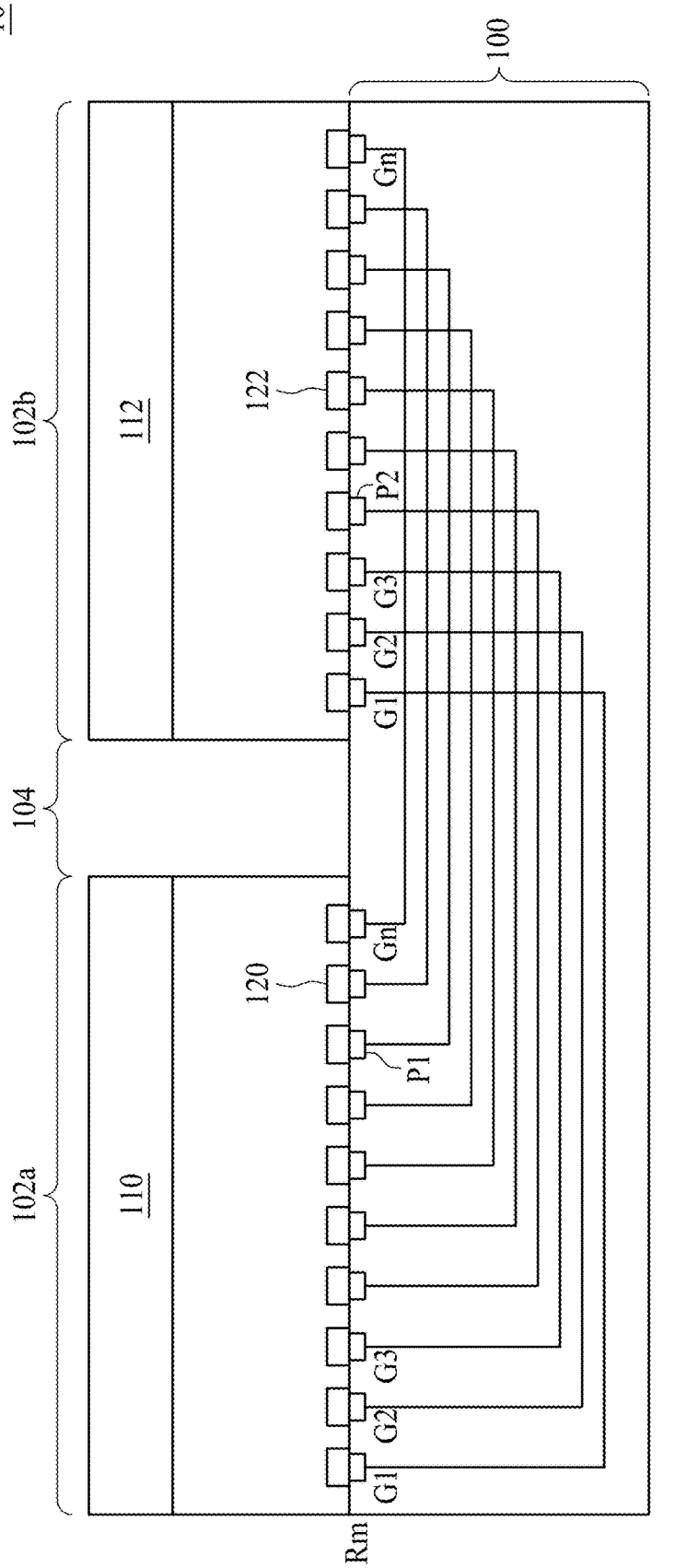

Referring to FIG. 11F, at operation 206, a first die 110 is bonded to the first pads P1 in the first region 102a and a second die 112 is bonded to the second pads P2 in the second region 102b. As mentioned above, the first die 110 can include a plurality of first die pad 120, and the second die 112 can include a plurality of second die pads 122. As shown in FIG. 11F, each of the first die pads 120 is bonded to one of the first pads P1 in the first array A1 in the first region 102a, and each of the second die pads 122 is bonded to one of the second pads P2 in the second array A2 in the second region 102b. In some embodiments, the first die 110 and the second die 112 can be bonded to the interconnect structure 100 by a hybrid bonding, but the disclosure is not limited thereto. Accordingly, a semiconductor structure 10 is obtained. As shown in FIG. 11F, by bonding the die pads 120/122 to the first/second pads P1/P2, connections between the first die 110 and the second die 112 are achieved.

It will be appreciated that the interconnect structure of the present disclosure includes a simple and more efficient routing design. In some embodiments, the interconnect structure may include two sets of pads: a plurality of first pads and a plurality of second pads, wherein the two sets of pads may be bonded to pads over two dies (also referred to as chips) or two packages. In some embodiments, the two sets of pads may be bonded to pads that are separated from each other, but disposed over a same wafer, a same die or a same package. In some embodiments, the first pads and the second pads are arranged to form arrays having columns and rows. In some embodiments, the rows formed by the first pads are aligned with the rows formed by the second pads. In some embodiments, the first pads may be grouped into a plurality of groups, such as a first group, a second group and an n$^{th}$ group, arranged in columns. In some embodiments, the second pads may be grouped into a plurality of groups, such as a first group, a second group and an n$^{th}$ group, arranged in columns. In some embodiments, the first pads and the second pads are electrically connected group-by-group. For example, the first pads and the second pads in the same group are electrically connected through conductive lines in a same layer. In some embodiments, the first pads and the second pads in the same group, including those in different rows, are electrically connected through conductive lines in the same layer. In some embodiments, the first pads and the second pads in another group are electrically connected through conductive lines in another layer. In some embodiments, the first pads and the second pads in separate groups, including those in a same row, are electrically connected through conductive lines in separate layers. Accordingly, utilization of the routing resources (the conductive lines) is improved and design for the routing resources is simplified by the provided interconnect structure.

According to one embodiment of the present disclosure, an interconnect structure is provided. The interconnect structure includes a plurality of first pads arranged to form a first array and a plurality of second pads arranged to form a second array. The first array has a first row, a second row and an m$^{th}$ row extending along a first direction and parallel to each other along a second direction. The first pads in each of the first row, the second row and the m$^{th}$ row are grouped into a first group, a second group and an n$^{th}$ group extending along the second direction. In some embodiments, m is an integer greater than 2, and n is an integer equal to or greater than 2. The second array has a first row, a second row and an m$^{th}$ row extending along the first direction and parallel to each other along the second direction. The second pads in each of the first row, the second row and the m$^{th}$ row are grouped into a first group, a second group and an n$^{th}$ group extending along the second direction. The interconnect structure further includes a plurality of first conductive lines disposed in a first layer, a plurality of second conductive lines disposed in a second layer and a plurality of n$^{th}$ conductive lines disposed in an n$^{th}$ layer. The first layer, the second layer and the n$^{th}$ layer are stacked to form a multi-layered structure. The first pads and the second pads are disposed over the first layer, the second layer and the n$^{th}$ layer. Each of the first pads in the first row in the first group of the first array is electrically connected to one of the second pads in the first row in the first group of the second array by one of the first conductive lines in the first layer. Each of the first pads in the second row in the first group of the first array is electrically connected to one of the second pads in the second row in the first group of the second array by one of the first conductive lines in the first layer. Each of the first pads in the m$^{th}$ row in the first group of the first array is electrically connected to one of the second pads in the m$^{th}$ row in the first group of the second array by one of the first conductive lines in the first layer.

According to one embodiment of the present disclosure, a method for forming a semiconductor structure is provided. The method includes following operations. A plurality of first landing ports is formed in a first region and in a second region, and a first conductive line is formed to couple one of the first landing ports in the first region to one of the first landing ports in the second region. A first via is formed on each of the first landing ports. A second landing ports is formed on each of the first vias in the first region and the second region, and a second conductive line is formed to couple one of the second landing ports in the first region and one of the second landing ports in the second region. A second via is formed on each of the second landing ports. A plurality of first pads is formed on each of the second vias in the first region, and a plurality of second pads is formed on each of the second vias in the second region. A first die is bonded to the first pads in the first region and a second die is bonded to the second pads in the second region.

According to one embodiment of the present disclosure, an interconnect structure is provided. The interconnect structure includes a plurality of first pads, a plurality of second pads, a plurality of first conductive lines, a plurality of second conductive lines and a plurality of n$^{th}$ conductive lines. The first pads are arranged to form a first array. The first array has a first row, a second row and an m$^{th}$ row extending along a first direction and parallel to each other along a second direction. The first pads in each of the first row, the second row and the m$^{th}$ row are grouped into a first group, a second group and an n$^{th}$ group extending along the second direction. M is an integer equal to or greater than 2, and n is an integer equal to or greater than 2. The second pads are arranged to form a second array. The second array has a first row, a second row and an $m^{th}$ row extending along the first direction and parallel to each other along the second direction. The second pads in each of the first row, the second row and the $m^{th}$ row are grouped into a first group, a second group and an $n^{th}$ group extending along the second direction. The first conductive lines are dispose in disposed in a first layer, the second conductive lines are disposed in a second layer, and the $n^{th}$ conductive lines are disposed in an $n^{th}$ layer. The first layer, the second layer and the $n^{th}$ layer are stacked to form a multi-layered structure. The first pads and the second pads are disposed over the first layer, the second layer and the $n^{th}$ layer. Each of the first pads in the first row in the first group of the first array is electrically connected one of the second pads in the first row in the first group of the second array by one of the first conductive lines in the first layer, and electrically isolated from the second ads in the second group and the $n^{th}$ group. Each of the first pads in the second row in the first group of the first array is electrically connected to one of the second pads in the second row in the first group of the second array by one of the first conductive lines in the first layer and electrically isolated from the second pads in the second group and the $n^{th}$ group. Each of the first pads in the $m^{th}$ row in the first group of the first array is electrically connected to one of the second pads in the $m^{th}$ row in the first group of the second array by one of the first conductive lines in the first layer, and electrically isolated form the second pads in the second group and the $n^{th}$ group.

An interconnect structure is provided. The interconnect structure includes a plurality of first pads arranged to form a first array, a plurality of second pads arranged to form a second array, a plurality of first conductive lines, a plurality of second conductive lines, and a plurality of $n^{th}$ conductive lines. The first array has a first row, a second row and an $m^{th}$ row extending along a first direction and parallel to each other along a second direction. The first pads in each of the first row, the second row and the $m^{th}$ row are grouped into a first group, a second group and an $n^{th}$ group extending along the second direction. m and n respectively is an integer. The second array has a first row, a second row and an $m^{th}$ row extending along the first direction and parallel with each other along the second direction. The second pads in each of the first row, the second row and the $m^{th}$ row are grouped into a first group, a second group and an $n^{th}$ group extending along the second direction. The first conductive line are disposed in a first layer, the second conductive lines are disposed in a second layer, and the $n^{th}$ conductive lines are disposed in an $n^{th}$ layer. The first layer, the second layer and the $n^{th}$ layer are stacked to form a multi-layered structure. The first pads and the second pads are disposed over the first layer, the second layer and the $n^{th}$ layer. Each of the first pads in the first row in the first group of the first array is electrically connected to one of the second pads in the first row in the first group of the second array by one of the first conductive lines in the first layer. Each of the first pads in the first row in the second group of the first array is electrically connected to one of the second pads in the first row in the second group of the second array by one of the second conductive lines in the second layer. Each of the first pads in the first row in the $n^{th}$ group of the first array is electrically connected to one of the second pads in the first row in the $n^{th}$ group of the second array by one of the $n^{th}$ conductive lines in the $n^{th}$ layer.

An interconnect structure is provided. The interconnect structure includes a plurality of first pads arranged to form a first array, a plurality of second pads arranged to form a second array, a plurality of first conductive lines, a plurality of second conductive lines, and a plurality of $n^{th}$ conductive lines. The first array has a first row, a second row and an $m^{th}$ row extending along a first direction and parallel to each other along a second direction. The first pads in each of the first row, the second row and the $m^{th}$ row are grouped into a first group, a second group and an $n^{th}$ group extending along the second direction. m is an integer equal to or greater than 2, and n is an integer equal to or greater than 2. The second array has a first row, a second row and an $m^{th}$ row extending along the first direction and parallel with each other along the second direction. The second pads in each of the first row, the second row and the $m^{th}$ row are grouped into a first group, a second group and an $n^{th}$ group extending along the second direction. The first conductive line are disposed in a first layer, the second conductive lines are disposed in a second layer, and the $n^{th}$ conductive lines are disposed in an $n^{th}$ layer. The first layer, the second layer and the $n^{th}$ layer are stacked to form a multi-layered structure. The first pads and the second pads are disposed over the first layer, the second layer and the $n^{th}$ layer. Each of the first pads in the first row in the first group of the first array is electrically connected to one of the second pads in the first row in the first group of the second array by one of the first conductive lines in the first layer, electrically isolated from the second pads in the second group and the $n^{th}$ group. Each of the first pads in the first row in the second group of the first array is electrically connected to one of the second pads in the first row in the second group of the second array by one of the second conductive lines in the second layer, and electrically isolated from the second pads in the first group and the $n^{th}$ group. Each of the first pads in the first row in the $n^{th}$ group of the first array is electrically connected to one of the second pads in the first row in the $n^{th}$ group of the second array by one of the $n^{th}$ conductive lines in the $n^{th}$ layer, and electrically isolated from the second pads in the first group and the second group.

An interconnect structure is provided. The interconnect structure includes a plurality of first pads, a plurality of second pads, and a plurality of conductive lines. The first pads are arranged to form a first column-and-row array, and the second pads are arranged to form a second column-and-row array. The first column-and-row array, the second column-and-row array and the conductive lines are disposed in a same layer. The first pads in adjacent rows in the first column-and-row array are separated from each other by a first vertical distance from a plan view, the second pads in adjacent rows in the second column-and-row array are separated from each other by a second vertical distance from the plan view. A sum of widths of the conductive lines electrically connecting the first pads and the second pads in the same row is less than the first vertical distance and the second vertical distance from the plan view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
a plurality of first pads arranged to form a first array, wherein the first array has a first row, a second row and an $m^{th}$ row extending along a first direction and parallel to each other along a second direction, wherein the first pads in each of the first row, the second row and the $m^{th}$ row are grouped into a first group, a second group and an $n^{th}$ group extending along the second direction, and m and n respectively is an integer;
a plurality of second pads arranged to form a second array, wherein the second array has a first row, a second row and an $m^{th}$ row extending along the first direction and parallel with each other along the second direction, wherein the second pads in each of the first row, the second row and the $m^{th}$ row are grouped into a first group, a second group and an $n^{th}$ group extending along the second direction; and
a plurality of first conductive lines disposed in a first layer, a plurality of second conductive lines disposed in a second layer and a plurality of $n^{th}$ conductive lines disposed in an $n^{th}$ layer, wherein the first layer, the second layer and the $n^{th}$ layer are stacked to form a multi-layered structure,
wherein the first pads and the second pads are disposed over the first layer, the second layer and the $n^{th}$ layer,
wherein a quantity of the layers of the multi-layered structure is equal to a quantity of the groups of the first pads, and equal to a quantity of the groups of the second pads,
wherein each of the first pads in the first row in the first group of the first array is electrically connected to one of the second pads in the first row in the first group of the second array by one of the first conductive lines in the first layer,
wherein each of the first pads in the first row in the second group of the first array is electrically connected to one of the second pads in the first row in the second group of the second array by one of the second conductive lines in the second layer, and
wherein each of the first pads in the first row in the $n^{th}$ group of the first array is electrically connected to one of the second pads in the first row in the $n^{th}$ group of the second array by one of the $n^{th}$ conductive lines in the $n^{th}$ layer.

2. The interconnect structure of claim 1, wherein:
each of the first pads in the second row in the first group of the first array is electrically connected to one of the second pads in the second row in the first group of the second array by one of the first conductive lines in the first layer,
each of the first pads in the second row in the second group of the first array is electrically connected to one of the second pads in the second row in the second group of the second array by one of the second conductive lines in the second layer, and
each of the first pads in the second row in the $n^{th}$ group of the first array is electrically connected to one of the second pads in the second row in the $n^{th}$ group of the second array by one of the $n^{th}$ conductive lines in the $n^{th}$ layer.

3. The interconnect structure of claim 2, wherein:
each of the first pads in the $m^{th}$ row in the first group of the first array is electrically connected to one of the second pads in the $m^{th}$ row in the first group of the second array by one of the first conductive lines in the first layer,
each of the first pads in the $m^{th}$ row in the second group of the first array is electrically connected to one of the second pads in the $m^{th}$ row in the second group of the second array by one of the second conductive lines in the second layer, and
each of the first pads in the $m^{th}$ row in the $n^{th}$ group of the first array is electrically connected to one of the second pads in the $m^{th}$ row in the $n^{th}$ group of the second array by one of the $n^{th}$ conductive lines in the $n^{th}$ layer.

4. The interconnect structure of claim 3, further comprising:
a plurality of first conductive pillars electrically connecting one of the first pads in the first row in the first group of the first array to one of the first conductive lines and to one of the second pads in the first row in the first group of the second array, electrically connecting one of the first pads in the second row in the first group of the first array to one of the first conductive lines and to one of the second pads in the second row in the first group of the second array, and electrically connecting one of the first pads in the $m^{th}$ row in the first group of the first array to one of the first conductive lines and to one of the second pads in the $m^{th}$ row in the first group of the second array;
a plurality of second conductive pillars electrically connecting one of the first pads in the first row in the second group of the first array to one of the second conductive lines and to one of the second pads in the first row in the second group of the second array, electrically connecting one of the first pads in the second row in the second group of the first array to one of the second conductive lines and to one of the second pads in the second row in the second group of the second array, and electrically connecting one of the first pads in the $m^{th}$ row in the second group of the first array to one of the second conductive lines and to one of the second pads in the $m^{th}$ row in the second group of the second array; and
a plurality of $n^{th}$ conductive pillars electrically connecting one of the first pads in the first row in the $n^{th}$ group of the first array to one of the $n^{th}$ conductive lines and to one of the second pads in the first row in the $n^{th}$ group of the second array, electrically connecting one of the first pads in the second row in the $n^{th}$ group of the first array to one of the $n^{th}$ conductive lines and to one of the second pads in the second row in the $n^{th}$ group of the second array, and electrically connecting one of the first pads in the $m^{th}$ row in the $n^{th}$ group of the first array to one of the $n^{th}$ conductive lines and to one of the second pads in the $m^{th}$ row in the $n^{th}$ group of the second array,
wherein the first conductive pillars include a first functional portion, the second conductive pillars include a second functional portion, the $n^{th}$ conductive pillars include an $n^{th}$ functional portion, a height of the first functional portion, a height of the second functional portion and a height of the $n^{th}$ functional portion are different from each other.

5. The interconnect structure of claim 1, wherein the first pads in the $m^{th}$ row in the first group of the first array are electrically isolated from the first pads in the $m^{th}$ row in other groups of the first array, and the second pads in the $m^{th}$ row in the first group of the second array are electrically isolated from the second pads in the $m^{th}$ row in other groups of the second array.

6. The interconnect structure of claim 1, wherein at least one of the first pads is adjacent to one of the second pads, and the at least one of the first pads is separated from the adjacent second pad by a horizontal distance, wherein the sum of widths of the first conductive lines electrically connecting the first pads and the second pads in the same row and the same group is less than the horizontal distance, the sum of widths of the second conductive lines electrically connecting the first pads and the second pads in the same row and the same group is less than the horizontal distance, and the sum of widths of the $n^{th}$ conductive lines electrically connecting the first pads and the second pads in the same row and the same group is less than the horizontal distance.

7. The interconnect structure of claim 1, wherein the second layer is disposed over the first layer, and the $n^{th}$ layer is disposed over an $(n-1)^{th}$ layer.

8. The interconnect structure of claim 1, wherein the second layer is disposed under the first layer, and the $n^{th}$ layer is disposed under an $(n-1)^{th}$ layer.

9. An interconnect structure comprising:
a plurality of first pads arranged to form a first array, wherein the first array has a first row, a second row and an $m^{th}$ row extending along a first direction and parallel to each other along a second direction, wherein the first pads in each of the first row, the second row and the $m^{th}$ row are grouped into a first group, a second group and an $n^{th}$ group extending along the second direction, m is an integer equal to or greater than 2, and n is an integer equal to or greater than 2;
a plurality of second pads arranged to form a second array, wherein the second array has a first row, a second row and an $m^{th}$ row extending along the first direction and parallel with each other along the second direction, wherein the second pads in each of the first row, the second row and the $m^{th}$ row are grouped into a first group, a second group and an $n^{th}$ group extending along the second direction; and
a plurality of first conductive lines disposed in a first layer, a plurality of second conductive lines disposed in a second layer and a plurality of $n^{th}$ conductive lines disposed in an $n^{th}$ layer, wherein the first layer, the second layer and the $n^{th}$ layer are stacked to form a multi-layered structure,
wherein the first pads and the second pads are disposed over the first layer, the second layer and the $n^{th}$ layer,
wherein a quantity of the layers of the multi-layered structure is equal to a quantity of the groups of the first pads, and equal to a quantity of the groups of the second pads,
wherein each of the first pads in the first row in the first group of the first array is electrically connected to one of the second pads in the first row in the first group of the second array by one of the first conductive lines in the first layer, and electrically isolated from the second pads in the second group and the $n^{th}$ group,
wherein each of the first pads in the first row in the second group of the first array is electrically connected to one of the second pads in the first row in the second group of the second array by one of the second conductive lines in the second layer, and electrically isolated from the second pads in the first group and the $n^{th}$ group, and
wherein each of the first pads in the first row in the $n^{th}$ group of the first array is electrically connected to one of the second pads in the first row in the $n^{th}$ group of the second array by one of the $n^{th}$ conductive lines in the $n^{th}$ layer, and electrically isolated from the second pads in the first group and the second group.

10. The interconnect structure of claim 9, further comprising:
a plurality of first conductive pillars electrically connecting one of the first pads in the first row in the first group of the first array to one of the first conductive lines and to one of the second pads in the first row in the first group of the second array;
a plurality of second conductive pillars electrically connecting one of the first pads in the first row in the second group of the first array to one of the second conductive lines and to one of the second pads in the first row in the second group of the second array; and
a plurality of third conductive pillars electrically connecting one of the first pads in the first row in the $n^{th}$ group of the first array to one of the $n^{th}$ conductive lines and to one of the second pads in the first row in the $n^{th}$ group of the second array.

11. The interconnect structure of claim 10 wherein a height of each first conductive pillar, a height of each second conducive pillar and a height of each third conductive pillar are different from each other.

12. The interconnect structure of claim 9, wherein:
each of the first pads in the second row in the first group of the first array is electrically connected to one of the second pads in the second row in the first group of the second array by one of the first conductive lines in the first layer,
each of the first pads in the second row in the second group of the first array is electrically connected to one of the second pads in the second row in the second group of the second array by one of the second conductive lines in the second layer, and
each of the first pads in the second row in the $n^{th}$ group of the first array is electrically connected to one of the second pads in the second row in the $n^{th}$ group of the second array by one of the $n^{th}$ conductive lines in the $n^{th}$ layer.

13. The interconnect structure of claim 9, wherein:
each of the first pads in the $m^{th}$ row in the first group of the first array is electrically connected to one of the second pads in the $m^{th}$ row in the first group of the second array by one of the first conductive lines in the first layer,
each of the first pads in the $m^{th}$ row in the second group of the first array is electrically connected to one of the second pads in the $m^{th}$ row in the second group of the second array by one of the second conductive lines in the second layer, and
each of the first pads in the $m^{th}$ row in the $n^{th}$ group of the first array is electrically connected to one of the second pads in the $m^{th}$ row in the $n^{th}$ group of the second array by one of the $n^{th}$ conductive lines in the $n^{th}$ layer.

14. The interconnect structure of claim 9, wherein the first pads in adjacent rows are separated from each other by a first vertical distance, the second pads in adjacent rows are separated from each other by a second vertical distance, and a sum of widths of the first conductive lines electrically connecting the first pads and the second pads in the same row and the same group is less than the first vertical distance and the second vertical distance, a sum of widths of the second conductive lines electrically connecting the first pads and the second pads in the same row and the same group is less than the first vertical distance and the second vertical distance, and a sum of widths of the $n^{th}$ conductive lines electrically connecting the first pads and the second pads in the same row and the same group is less than the first vertical distance and the second vertical distance.

15. The interconnect structure of claim 14, wherein at least one of the first pads is adjacent to one of the second pads, and the at least one of the first pads is separated from the adjacent second pad by a horizontal distance, wherein the sum of widths of the first conductive lines electrically connecting the first pads and the second pads in the same row and the same group is less than the horizontal distance, the sum of widths of the second conductive lines electrically connecting the first pads and the second pads in the same row and the same group is less than the horizontal distance, and the sum of widths of the $n^{th}$ conductive lines electrically connecting the first pads and the second pads in the same row and the same group is less than the horizontal distance.

16. The interconnect structure of claim 9, the first pads in the $m^{th}$ row in the first group of the first array are electrically isolated from the first pads in the same row in other groups of the first array, and the second pads in the $m^{th}$ row in the first group of the second array are electrically isolated from the second pads in the same row in other groups of the second array.

17. An interconnect structure comprising:
- a plurality of first pads arranged to form a first column-and-row array;
- a plurality of second pads arranged to form a second column-and-row array; and
- a plurality of conductive lines, wherein the first column-and-row array, the second column-and-row array and the plurality of conductive lines are disposed in a same layer, wherein the first pads in a first row and a second row of the first column-and-row array are separated from each other by a first vertical distance from a plan view, the second pads in a first row and a second row of the second column-and-row array are separated from each other by a second vertical distance from the plan view, wherein the first pad in the first row and a first column of the first column-and-row array is electrically connected to the second pad in the first row and a first column of the second column-and-row array by a first conductive line of the plurality of conductive lines, wherein the first pad in the first row and a second column of the first column-and-row array is electrically connected to the second pad in the first row and a second column of the second column-and-row array by a second conductive line of the plurality of conductive lines, wherein a sum of widths of the first and second conductive lines is less than the first vertical distance and the second vertical distance from the plan view.

18. The interconnect structure of claim 17, wherein at least one of the first pads is adjacent to one of the second pads, and the at least one of the first pads is separated from the adjacent second pad by a first horizontal distance, wherein the sum of widths of the conductive lines electrically connecting the first pads and the second pads in the same row is less than the horizontal distance.

19. The interconnect structure of claim 17, wherein the first pads in the same row in the first column-and-row array are separated from each other by a second horizontal distance from the plan view, and the second pads in the same row in the second column-and-row array are separated from each other by a third horizontal distance from the plan view.

20. The interconnect structure of claim 19, wherein the second horizontal distance and the third horizontal distance are the same.

* * * * *